United States Patent
Miyazaki

(10) Patent No.: US 11,206,010 B2
(45) Date of Patent: Dec. 21, 2021

(54) RADIO FREQUENCY MODULE, FRONT END MODULE, AND COMMUNICATION DEVICE

(71) Applicant: Murata Manufacturing Co., Ltd., Kyoto (JP)

(72) Inventor: Daisuke Miyazaki, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 22 days.

(21) Appl. No.: 16/788,805

(22) Filed: Feb. 12, 2020

(65) Prior Publication Data
US 2020/0186126 A1    Jun. 11, 2020

Related U.S. Application Data

(63) Continuation of application No. PCT/JP2018/016831, filed on Apr. 25, 2018.

(30) Foreign Application Priority Data

Aug. 31, 2017    (JP) .............................. JP2017-167430

(51) Int. Cl.
*H03H 9/64*    (2006.01)
*H03F 3/195*    (2006.01)
(Continued)

(52) U.S. Cl.
CPC ........... *H03H 9/6483* (2013.01); *H03F 3/195* (2013.01); *H03F 3/68* (2013.01); *H03H 1/00* (2013.01);
(Continued)

(58) Field of Classification Search
CPC .......... H03H 9/6483; H03H 1/00; H03H 7/18; H03H 9/14544; H03H 9/25; H03H 9/725;
(Continued)

(56) References Cited

U.S. PATENT DOCUMENTS 8,582,547 B2 * 11/2013 Kemmochi .......... H04B 1/0057
370/343
2006/0226933 A1   10/2006 Takahashi
(Continued)

FOREIGN PATENT DOCUMENTS

JP    H09-172340 A    6/1997
JP    2006-135921 A    5/2006
(Continued)

OTHER PUBLICATIONS

International Search Report for International Application No. PCT/JP2018/016831 dated Jul. 31, 2018.
(Continued)

*Primary Examiner* — Hafizur Rahman
(74) *Attorney, Agent, or Firm* — Pearne & Gordon LLP

(57) ABSTRACT

A radio frequency module includes a switch circuit that includes selection terminals, a filter that allows the signal in the first frequency band to pass therethrough, a filter that allows the signal in the second frequency band to pass therethrough, a phase adjustment circuit that is connected to the selection terminal and the filter, and a phase adjustment circuit that is connected to the selection terminal and the filter. The filter includes an acoustic wave resonator that is formed on a substrate that has piezoelectricity. The filter includes an acoustic wave resonator that is formed on a substrate that has piezoelectricity. At least one of circuit elements that are included in the phase adjustment circuit is formed on the substrate. At least one of circuit elements that are included in the phase adjustment circuit is formed on the substrate.

20 Claims, 17 Drawing Sheets

(51) Int. Cl.

| | |
|---|---|
| *H03F 3/68* | (2006.01) |
| *H03H 1/00* | (2006.01) |
| *H03H 7/18* | (2006.01) |
| *H03H 9/145* | (2006.01) |
| *H03H 9/25* | (2006.01) |
| *H04B 1/44* | (2006.01) |
| *H03H 9/72* | (2006.01) |

(52) U.S. Cl.
CPC .......... *H03H 7/18* (2013.01); *H03H 9/14544* (2013.01); *H03H 9/25* (2013.01); *H04B 1/44* (2013.01); *H03F 2200/165* (2013.01); *H03F 2200/171* (2013.01); *H03F 2200/294* (2013.01); *H03F 2200/451* (2013.01); *H03H 9/725* (2013.01); *H03H 2001/0021* (2013.01)

(58) Field of Classification Search
CPC ... H03H 2001/0021; H03F 3/195; H03F 3/68; H03F 2200/165; H03F 2200/171; H03F 2200/294; H03F 2200/451; H04B 1/44
USPC .......................................................... 330/185
See application file for complete search history.

(56) References Cited

U.S. PATENT DOCUMENTS

| | | |
|---|---|---|
| 2012/0208591 A1 | 8/2012 | Uejima |
| 2016/0197643 A1 | 7/2016 | Uejima |
| 2016/0261038 A1 | 9/2016 | Tanaka |
| 2017/0005637 A1 | 1/2017 | Nakamura |

FOREIGN PATENT DOCUMENTS

| | | |
|---|---|---|
| JP | 2006-295434 A | 10/2006 |
| JP | 2009-225094 A | 10/2009 |
| JP | 2012-044290 A | 3/2012 |
| JP | 2016-140110 A | 8/2016 |
| JP | 2017-017520 A | 1/2017 |
| WO | 2015/041125 A1 | 3/2015 |

OTHER PUBLICATIONS

Written Opinion for International Application No. PCT/JP2018/016831 dated Jul. 31, 2018.

\* cited by examiner

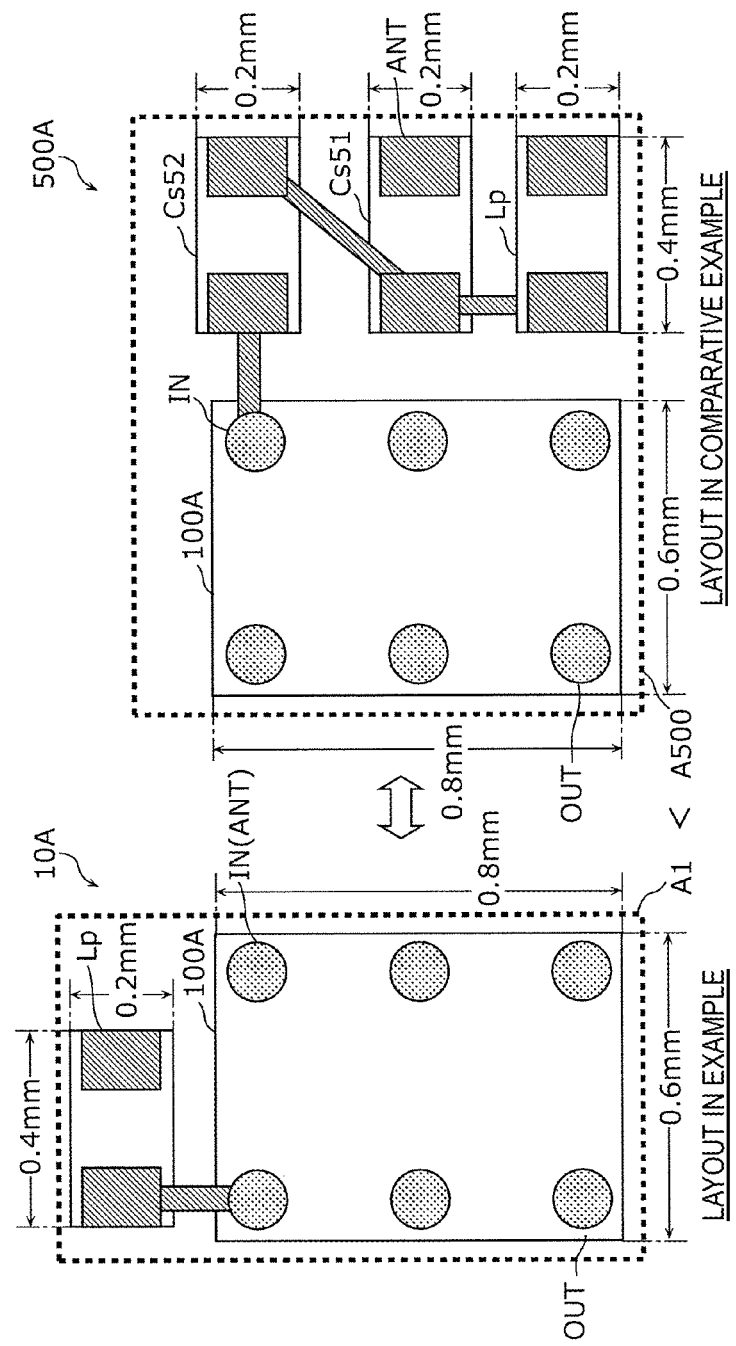

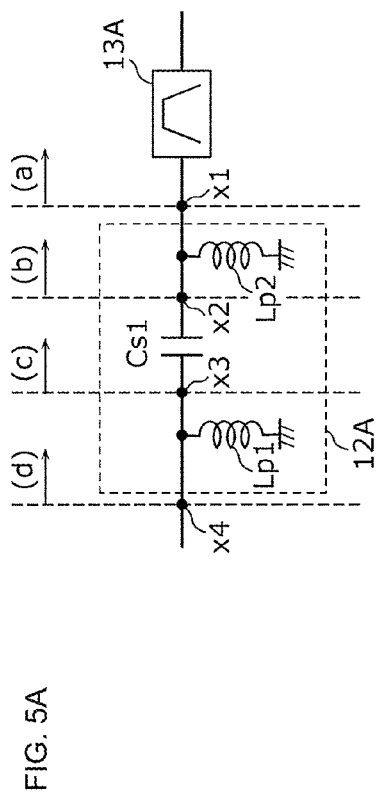
FIG. 5A
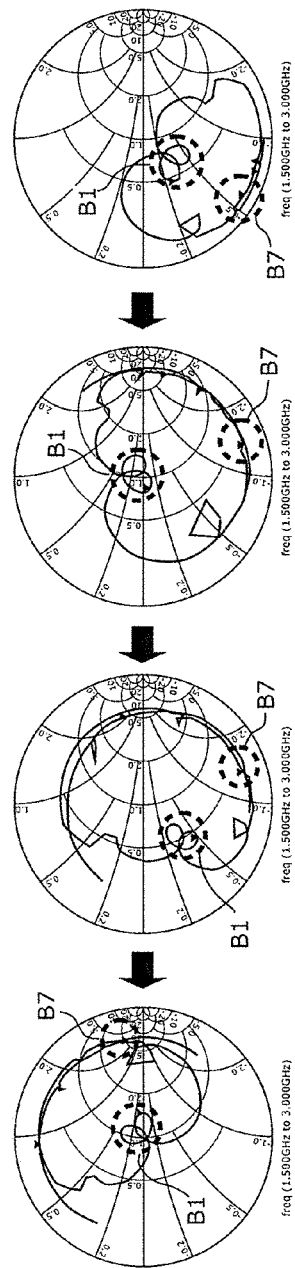
FIG. 5B
FIG. 5C
FIG. 5D
FIG. 5E

FIG. 10A
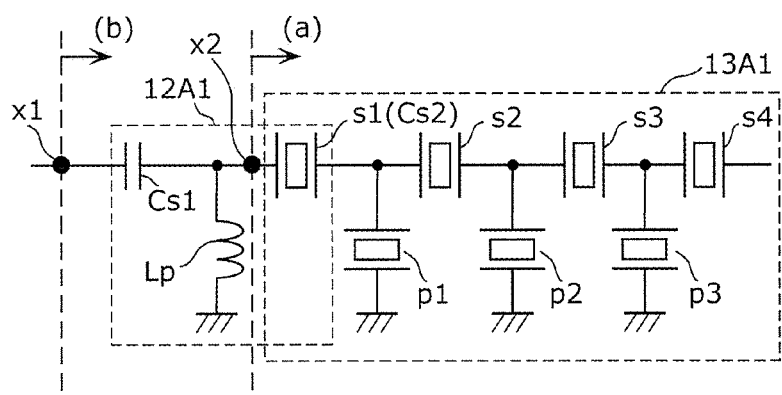
FIG. 10C 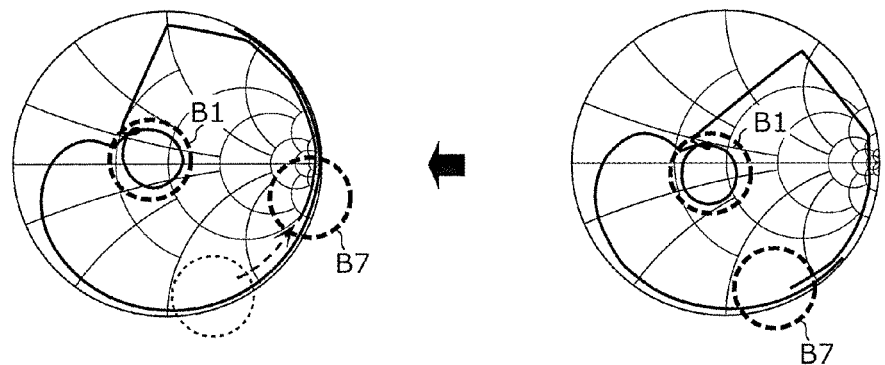 FIG. 10B

FIG. 13A
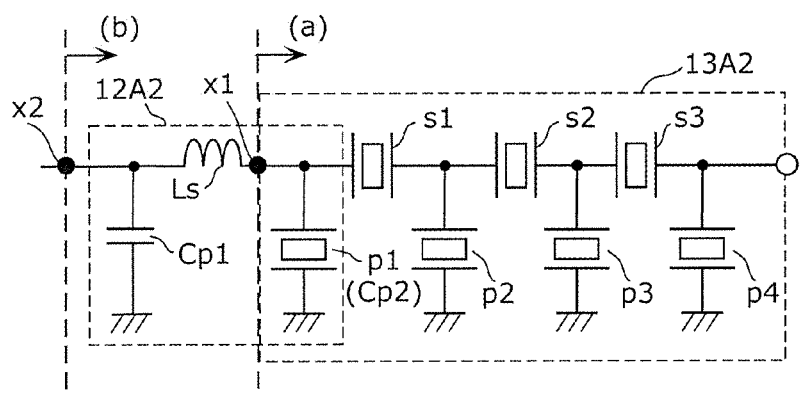
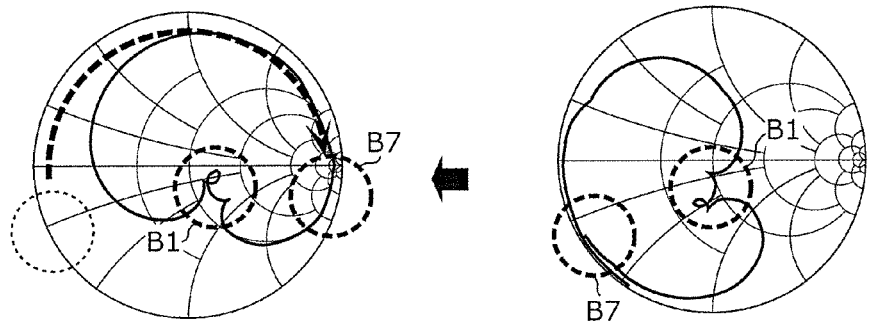
FIG. 13C          FIG. 13B

RADIO FREQUENCY MODULE, FRONT END MODULE, AND COMMUNICATION DEVICE

This is a continuation of International Application No. PCT/JP2018/016831 filed on Apr. 25, 2018 which claims priority from Japanese Patent Application No. 2017-167430 filed on Aug. 31, 2017. The contents of these applications are incorporated herein by reference in their entireties.

BACKGROUND OF THE DISCLOSURE

Field of the Disclosure

The present disclosure relates to a radio frequency module, a front end module, and a communication device.

Description of the Related Art

Patent Document 1 discloses a multi-band radio frequency module that transmits and receives radio frequency signals in different frequency bands (bands). This radio frequency module includes a switch IC (Integrated Circuit) that is disposed near an antenna, a first SAW (Surface Acoustic Wave) duplexer for transmission and reception of a signal in a first frequency band, a second SAW duplexer for transmission and reception of a signal in a second frequency band, a first phase circuit that is disposed between the switch IC and the first SAW duplexer, and a second phase circuit that is disposed between the switch IC and the second SAW duplexer. Because of the first phase circuit and the second phase circuit, the second SAW duplexer substantially opens in the first frequency band when viewed from the switch IC, and the first SAW duplexer substantially opens in the second frequency band when viewed from the switch IC. Consequently, the signal in the first frequency band and the signal in the second frequency band can propagate with a low loss.

Patent Document 1: International Publication No. 2015/041125

BRIEF SUMMARY OF THE DISCLOSURE

In recent years, a multi-band wireless communication terminal simultaneously uses transmission signals or reception signals in different frequency bands with a single antenna, which is called a carrier aggregation (CA) method. With the introduction of the CA method, the number of the frequency bands (bands) that are used in a single terminal is increased. However, there are more strict requirements for the decrease in the size of a radio frequency module that is disposed at a front end.

In the radio frequency module disclosed in Patent Document 1, however, the phase circuits are disposed for the frequency bands to reduce the insertion loss of a signal path. Accordingly, the increase in the number of the bands causes a problem in that the size of the radio frequency module increases.

In view of this, the present disclosure has been accomplished to solve the above problem, and it is an object of the present disclosure to provide a radio frequency module, a front end module, and a communication device that have a reduced insertion loss in a CA mode and have a decreased size.

To achieve the above object, a radio frequency module according to an aspect of the present disclosure is a radio frequency module capable of simultaneously transmitting, receiving, or transmitting and receiving at least a signal in a first frequency band and a signal in a second frequency band a frequency of which differs from that of the first frequency band. The radio frequency module includes a switch circuit that includes a common terminal, a first selection terminal, and a second selection terminal, a first filter that allows the signal in the first frequency band to pass therethrough, a second filter that allows the signal in the second frequency band to pass therethrough, a first phase adjustment circuit that is connected between the first selection terminal and the first filter and that includes one or more circuit elements, and a second phase adjustment circuit that is connected between the second selection terminal and the second filter and that includes one or more circuit elements. The first filter includes an acoustic wave resonator that includes a first substrate that has piezoelectricity and an IDT electrode that is formed on the first substrate. The second filter includes an acoustic wave resonator that includes a second substrate that has piezoelectricity and an IDT electrode that is formed on the second substrate. At least one of the one or more circuit elements that are included in the first phase adjustment circuit is formed on the first substrate, and at least one of the one or more circuit elements that are included in the second phase adjustment circuit is formed on the second substrate.

This enables the signal bandpass characteristics of the first filter and the second filter to be improved in a so-called CA mode in which the signal in the first frequency band and the signal in the second frequency band are simultaneously transmitted, received, or transmitted and received. That is, the amount of a leak of the signal in the first frequency band to the second filter can be minimized, and the pass band insertion loss of the first filter can be reduced. In addition, the amount of a leak of the signal in the second frequency band to the first filter can be minimized, and the pass band insertion loss of the second filter can be reduced.

Furthermore, since the one or more circuit elements that are included in the first phase adjustment circuit are formed on the first substrate on which the acoustic wave resonator of the first filter is formed, and the one or more circuit elements that are included in the second phase adjustment circuit are formed on the second substrate on which the acoustic wave resonator of the second filter is formed, the number of circuit elements that are formed on neither the first substrate nor the second substrate can be decreased among the circuit elements that are included in the first phase adjustment circuit and the second phase adjustment circuit. Accordingly, the insertion loss in the CA mode is reduced, and the size of the radio frequency module can be decreased.

The first phase adjustment circuit may include a first circuit element and a second circuit element that are disposed on a path connecting the first selection terminal and the first filter to each other and that are connected to each other in series, and a third circuit element that is disposed between a ground and a connection node of the first circuit element and the second circuit element. Each of the first circuit element, the second circuit element, and the third circuit element may be an inductor or a capacitor.

The first filter may include a first input-output terminal that is formed on the first substrate and that is connected to the first phase adjustment circuit, a second input-output terminal that is formed on the first substrate, one or more series arm resonators that are disposed on a first path connecting the first input-output terminal and the second input-output terminal to each other and that include the acoustic wave resonator, and one or more parallel arm resonators that are disposed on a second path connecting a node on the first path and a ground to each other and that include the acoustic wave resonator. Among the one or more series arm resonators and the one or more parallel arm resonators, only a first series arm resonator may be directly connected to the first input-output terminal. The second circuit element, of the first circuit element and the second circuit element, may be connected to the first input-output terminal. The first series arm resonator may include the second circuit element and may function as the acoustic wave resonator of the first filter and a capacitive element of the first phase adjustment circuit.

In the case where the first filter includes acoustic wave resonators, and a surface acoustic wave resonator that is connected nearest to the first input-output terminal is the series arm resonator, an impedance when the first filter is viewed from the first input-output terminal is capacitive and close to a high impedance (that in an open state). In this case, the first phase adjustment circuit is preferably a T-type circuit in which a capacitor is disposed on a series arm, and an inductor is disposed on a parallel arm in order to keep the impedance in an own band equal to a characteristic impedance (50Ω) and to keep the impedance in a CA partner band close to a high impedance (that in the open state). This decreases an amount in which the impedance in the CA partner band is shifted counterclockwise. That is, the inductance value of a parallel arm inductor can be decreased. Accordingly, the impedance matching can be precise, and the size of the first phase adjustment circuit can be decreased.

The second circuit element that is included in the first phase adjustment circuit is the first series arm resonator of the first filter. This decreases the size of the first substrate.

The second phase adjustment circuit may include a fourth circuit element and a fifth circuit element that are disposed on a path connecting the second selection terminal and the second filter to each other and that are connected to each other in series, and a sixth circuit element that is disposed between a ground and a connection node of the fourth circuit element and the fifth circuit element. Each of the fourth circuit element, the fifth circuit element, and the sixth circuit element may be an inductor or a capacitor.

The second filter may include a third input-output terminal that is formed on the second substrate and that is connected to the second phase adjustment circuit, a fourth input-output terminal that is formed on the second substrate, one or more series arm resonators that are disposed on a third path connecting the third input-output terminal and the fourth input-output terminal to each other and that include the acoustic wave resonator, and one or more parallel arm resonators that are disposed on a fourth path connecting a node on the third path and the ground to each other and that include the acoustic wave resonator. Among the one or more series arm resonators and the one or more parallel arm resonators, only a second series arm resonator may be directly connected to the third input-output terminal. The fifth circuit element, of the fourth circuit element and the fifth circuit element, may be connected to the third input-output terminal. The second series arm resonator may include the fifth circuit element and may function as the acoustic wave resonator of the second filter and a capacitive element of the second phase adjustment circuit.

In the case where the second filter includes acoustic wave resonators, and a surface acoustic wave resonator that is connected nearest to the third input-output terminal is the series arm resonator, an impedance when the second filter is viewed from the third input-output terminal is capacitive and close to a high impedance (that in the open state). In this case, the second phase adjustment circuit is preferably a T-type circuit in which a capacitor is disposed on a series arm, and an inductor is disposed on a parallel arm in order to keep the impedance in the own band equal to the characteristic impedance (50Ω) and to keep the impedance in the CA partner band close to a high impedance (that in the open state). This decreases the amount in which the impedance in the CA partner band is shifted counterclockwise. That is, the inductance value of the parallel arm inductor can be decreased. Accordingly, the impedance matching can be precise, and the size of the second phase adjustment circuit can be decreased.

The fifth circuit element that is included in the second phase adjustment circuit is the second series arm resonator of the second filter. This decreases the size of the second substrate.

The first phase adjustment circuit may include a seventh circuit element that is disposed on a path connecting the first selection terminal and the first filter to each other, an eighth circuit element that is disposed between a ground and a connection node of the first selection terminal and the seventh circuit element, and a ninth circuit element that is disposed between the ground and a connection node of the seventh circuit element and the first filter. Each of the seventh circuit element, the eighth circuit element, and the ninth circuit element may be an inductor or a capacitor.

The first filter may include a first input-output terminal that is formed on the first substrate and that is connected to the first phase adjustment circuit, a second input-output terminal that is formed on the first substrate, one or more series arm resonators that are disposed on a first path connecting the first input-output terminal and the second input-output terminal to each other and that include the acoustic wave resonator, and one or more parallel arm resonators that are disposed on a second path connecting a node on the first path and the ground to each other and that include the acoustic wave resonator. Among the one or more series arm resonators and the one or more parallel arm resonators, a first parallel arm resonator may be directly connected to the first input-output terminal. The ninth circuit element, of the eighth circuit element and the ninth circuit element, may be connected to the first input-output terminal. The first parallel arm resonator may include the ninth circuit element and may function as the acoustic wave resonator of the first filter and a capacitive element of the first phase adjustment circuit.

In the case where the first filter includes acoustic wave resonators, and a surface acoustic wave resonator that is connected nearest to the first input-output terminal is the parallel arm resonator, the impedance when the first filter is viewed from the first input-output terminal is capacitive and close to a low impedance (that in a short circuit state). In this case, the first phase adjustment circuit is preferably a π-type circuit in which a capacitor is disposed on a parallel arm, and an inductor is disposed on a series arm in order to keep the impedance in the own band equal to the characteristic impedance (50Ω) and to keep the impedance in the CA partner band close to a high impedance (that in the open state). This decreases an amount in which the impedance in the CA partner band is shifted clockwise. That is, the inductance value of a series arm inductor can be decreased. Accordingly, the impedance matching can be precise, and the size of the first phase adjustment circuit can be decreased.

The ninth circuit element that is included in the first phase adjustment circuit is the first parallel arm resonator of the first filter. This decreases the size of the first substrate.

The second phase adjustment circuit may include a tenth circuit element that is disposed on a path connecting the second selection terminal and the second filter to each other, an eleventh circuit element that is disposed between a ground and a connection node of the second selection terminal and the tenth circuit element, and a twelfth circuit element that is disposed between the ground and a connection node of the tenth circuit element and the second filter. Each of the tenth circuit element, the eleventh circuit element, and the twelfth circuit element may be an inductor or a capacitor.

This enables a phase to be shifted stepwise at the connection nodes of the circuit elements that are included in the phase adjustment circuits, and appropriate selection of circuit structures described above such as a T-type, a π-type, an inductor, and a capacitor improves the extensibility of phase adjustment.

The second filter may include a third input-output terminal that is formed on the second substrate and that is connected to the second phase adjustment circuit, a fourth input-output terminal that is formed on the second substrate, one or more series arm resonators that are disposed on a third path connecting the third input-output terminal and the fourth input-output terminal to each other and that include the acoustic wave resonator, and one or more parallel arm resonators that are disposed on a fourth path connecting a node on the third path and the ground to each other and that include the acoustic wave resonator. Among the one or more series arm resonators and the one or more parallel arm resonators, a second parallel arm resonator may be directly connected to the third input-output terminal. The twelfth circuit element, of the eleventh circuit element and the twelfth circuit element, may be connected to the third input-output terminal. The second parallel arm resonator may include the twelfth circuit element and functions as the acoustic wave resonator of the second filter and a capacitive element of the second phase adjustment circuit.

In the case where the second filter includes acoustic wave resonators, and a surface acoustic wave resonator that is connected nearest to the third input-output terminal is the parallel arm resonator, the impedance when the second filter is viewed from the third input-output terminal is capacitive and close to a low impedance (that in the short circuit state). In this case, the second phase adjustment circuit is preferably a 7c-type circuit in which a capacitor is disposed on a parallel arm, and an inductor is disposed on a series arm in order to keep the impedance in the own band equal to the characteristic impedance (50Ω) and to keep the impedance in the CA partner band close to a high impedance (that in the open state). This decreases the amount in which the impedance in the CA partner band is shifted clockwise. That is, the inductance value of the series arm inductor can be decreased. Accordingly, the impedance matching can be precise, and the size of the second phase adjustment circuit can be decreased.

The twelfth circuit element that is included in the second phase adjustment circuit is the second parallel arm resonator of the second filter. This decreases the size of the second substrate.

The one or more circuit elements that are included in the first phase adjustment circuit may include a first capacitor. The first capacitor may be formed on the first substrate.

This enables the size of the radio frequency module to be effectively decreased in a manner in which the first capacitor that is included in the first phase adjustment circuit is formed on the first substrate.

The first capacitor may include a comb teeth capacitance electrode that is formed on the first substrate.

This enables the first capacitor to be formed in the same manufacturing process as a manufacturing process in which the IDT electrode of the first filter is manufactured in a manner in which the first capacitor that is included in the first phase adjustment circuit is formed by the comb teeth capacitance electrode on the first substrate, and the manufacturing process can be simplified.

A resonant frequency and an anti-resonant frequency of the first capacitor may be in a band lower or higher than the first frequency band.

This eliminates unnecessary spurious emission due to the resonance point and the anti-resonance point of the first capacitor in the pass band of the first filter. Accordingly, the loss can be kept low in the pass band.

In a plan view of the first substrate, a first direction perpendicular to electrode fingers that are included in the comb teeth capacitance electrode and that are parallel to each other may differ from a second direction perpendicular to electrode fingers that are included in the IDT electrode of the first filter and that are parallel to each other.

This inhibits a spurious wave due to excitation of the comb teeth capacitance electrode from interfering with an acoustic wave due to excitation of the IDT electrode of the first filter. Accordingly, unnecessary spurious emission can be inhibited from overlapping a signal that passes through the first filter.

The first substrate may satisfy that an angle that is formed between the first direction and the second direction is no less than 80° and no more than 100°.

In this case, the impedance minimum point (resonance point) of a comb teeth capacitance in the case where the first direction coincides with the second direction can be increased by 20 dB or more, and the impedance maximum point thereof (anti-resonance point) can be decreased by 20 dB or more.

The radio frequency module may simultaneously transmit, receive, or transmit and receive the signal in the first frequency band and the signal in the second frequency band when the common terminal and the first selection terminal are in a conducting state, and the common terminal and the second selection terminal are in a conducting state.

The switch circuit may further include a third selection terminal and a fourth selection terminal. The radio frequency module may further includes a third filter that allows a signal in a third frequency band a frequency of which differs from those of the first frequency band and the second frequency band to pass therethrough, a fourth filter that allows a signal in a fourth frequency band a frequency of which differs from those of the first frequency band, the second frequency band, and the third frequency band to pass therethrough, a third phase adjustment circuit that is connected between the third selection terminal and the third filter and that includes one or more circuit elements, and a fourth phase adjustment circuit that is connected between the fourth selection terminal and the fourth filter and that includes one or more circuit elements. The third filter may include an acoustic wave resonator that includes a third substrate that has piezoelectricity and an IDT electrode that is formed on the third substrate. The fourth filter may include an acoustic wave resonator that includes a fourth substrate that has piezoelectricity and an IDT electrode that is formed on the fourth substrate. At least one of the one or more circuit elements that are included in the third phase adjustment circuit may be formed on the third substrate, and at least one of the one or more circuit elements that are included in the fourth phase adjustment circuit may be formed on the fourth substrate. The first frequency band may be a Band1 reception band (2110 to 2170 MHz) of LTE (Long Term Evolution). The second frequency band may be a Band3 reception band (1805 to 1880 MHz) of LTE. The third frequency band may be a Band1 reception band (2620 to 2690 MHz) of LTE. The fourth frequency band may be a Band5 reception band (869 to 894 MHz), a Band8 reception band (925 to 960 MHz), a Band20 reception band (791 to 821 MHz), or a Band40 band (2300 to 2400 MHz) of LTE. The radio frequency module may simultaneously transmit, receive, or transmit and receive at least two signals among the signal in the first frequency band, the signal in the second frequency band, the signal in the third frequency band, and the signal in the fourth frequency band.

The switch circuit may further include a third selection terminal and a fourth selection terminal. The radio frequency module may further include a third filter that allows a signal in a third frequency band a frequency of which differs from those of the first frequency band and the second frequency band to pass therethrough, a fourth filter that allows a signal in a fourth frequency band a frequency of which differs from those of the first frequency band, the second frequency band, and the third frequency band to pass therethrough, a third phase adjustment circuit that is connected between the third selection terminal and the third filter and that includes one or more circuit elements, and a fourth phase adjustment circuit that is connected between the fourth selection terminal and the fourth filter and that includes one or more circuit elements. The third filter may include an acoustic wave resonator that includes a third substrate that has piezoelectricity and an IDT electrode that is formed on the third substrate. The fourth filter may include an acoustic wave resonator that includes a fourth substrate that has piezoelectricity and an IDT electrode that is formed on the fourth substrate. At least one of the one or more circuit elements that are included in the third phase adjustment circuit may be formed on the third substrate, and at least one of the one or more circuit elements that are included in the fourth phase adjustment circuit may be formed on the fourth substrate. The first frequency band may be a Band2 reception band (1930 to 1990 MHz) of LTE. The second frequency band may be a Band4 reception band (2110 to 2155 MHz) of LTE. The third frequency band may be a Band30 reception band (2350 to 2360 MHz) of LTE. The fourth frequency band may be a Band5 reception band (869 to 894 MHz), a Band29 reception band (717 to 728 MHz), or a Band12 reception band (729 to 746 MHz) of LTE. The radio frequency module may simultaneously transmit, receive, or transmit and receive at least two signals among the signal in the first frequency band, the signal in the second frequency band, the signal in the third frequency band, and the signal in the fourth frequency band.

In these cases, the insertion loss when two or more bands of four bands of LTE are used in the CA mode is decreased, and the size of the radio frequency module can be decreased.

A front end module according to an aspect of the present disclosure includes the radio frequency module described above, a first amplifier circuit that is connected to the first filter, and a second amplifier circuit that is connected to the second filter.

This enables the front end module to have a reduced insertion loss in the CA mode and have a decreased size.

A communication device according to an aspect of the present disclosure includes a RF integrated circuit that processes a radio frequency signal that is transmitted and received by an antenna element, and the above front end module that communicates the radio frequency signal between the antenna element and the RF integrated circuit.

This enables the communication device to have a reduced insertion loss in the CA mode and have a decreased size.

The present disclosure provides a radio frequency module, a front end module, and a communication device that have a reduced insertion loss in the CA mode and have a decreased size.

BRIEF DESCRIPTION OF THE SEVERAL VIEWS OF THE DRAWINGS

FIG. 2C illustrates comparison between the layouts of the radio frequency modules in the first example and the comparative example.

FIGS. 5A, 5B, 5C, 5D and 5E illustrate Smith charts representing the impedance of a filter viewed from nodes of the phase adjustment circuit.

FIGS. 10A, 10B and 10C illustrate Smith charts representing the impedance of the filter viewed from nodes of the phase adjustment circuit in the third example.

FIGS. 13A, 13B and 13C illustrate Smith charts representing the impedance of the filter viewed from nodes of the phase adjustment circuit in the fourth example.

DETAILED DESCRIPTION OF THE DISCLOSURE

Figure 1:
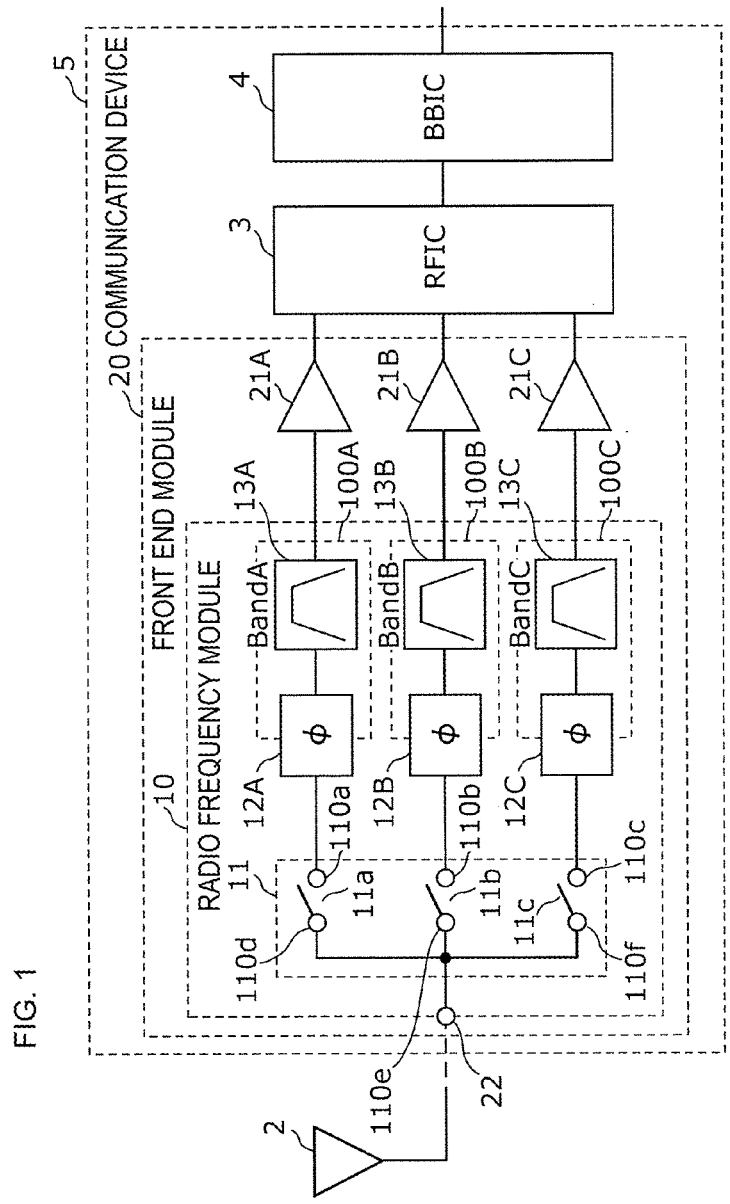
FIG. 1 is a circuit block diagram of a communication device and an antenna element according to an embodiment.

Embodiments of the present disclosure will hereinafter be described in detail with reference to examples and the drawings thereof. The examples described below are comprehensive or specific examples. In the examples described later, numerical values, shapes, materials, components, and the arrangement and connection form of the components are described by way of example and do not limit the present disclosure. Among the components in the examples below, components that are not recited in the independent claim are described as optional components. In the drawings, the dimensions of the components or ratios of the dimensions are not necessarily illustrated strictly.

Embodiment

[1.1 Circuit Structure of Communication Device]

FIG. 1 is a circuit block diagram of a communication device 5 and an antenna element 2 according to an embodiment. The communication device 5 illustrated in the figure includes a front end module 20, a RF integrated circuit (RFIC) 3, and a base band integrated circuit (BBIC) 4.

The front end module 20 includes a radio frequency module 10 and reception amplifier circuits 21A, 21B, and 21C.

The radio frequency module 10 includes a switch circuit 11, phase adjustment circuits 12A, 12B, and 12C, filters 13A, 13B, and 13C, and an antenna common terminal 22.

The switch circuit 11 includes common terminals 110d, 110e, and 110f and selection terminals 110a, 110b, and 110c and includes a SPST (Singe Pole Single Throw) switch 11a that switches between conduction and non-conduction between the common terminal 110d and the selection terminal 110a, a SPST switch 11b that switches between conduction and non-conduction between the common terminal 110e and the selection terminal 110b, and a SPST switch 11c that switches between conduction and non-conduction between the common terminal 110f and the selection terminal 110c. The selection terminal 110a corresponds to a first selection terminal. The selection terminal 110b corresponds to a second selection terminal. The common terminals 110d, 110e, and 110f are connected to the antenna common terminal 22. The common terminals 110d, 110e, and 110f may be integrated into a single common terminal.

The filter 13A corresponds to a first filter that selectively allows a signal in a first frequency band (BandA) to pass therethrough by itself. The filter 13B corresponds to a second filter that selectively allows a signal in a second frequency band (BandB) that differs from the first frequency band to pass therethrough by itself. The filter 13C corresponds to a third filter that selectively allows a signal in a third frequency band (BandC) that differs from the first frequency band and second frequency band to pass therethrough by itself.

The filter 13A is a surface acoustic wave filter that includes a surface acoustic wave resonator that includes a substrate 100A (first substrate) that has piezoelectricity and an IDT (Inter Digital Transducer) electrode that is formed on the substrate 100A. The filter 13B is a surface acoustic wave filter that includes a surface acoustic wave resonator that includes a substrate 100B (second substrate) that has the piezoelectricity and an IDT electrode that is formed on the substrate 100B. The filter 13C is a surface acoustic wave filter that includes a surface acoustic wave resonator that includes a substrate 100C that has the piezoelectricity and an IDT electrode that is formed on the substrate 100C.

Each of the filters 13A to 13C may be a boundary acoustic wave filter or an acoustic wave filter that uses a bulk acoustic wave (BAW) other than the surface acoustic wave filter.

The substrate that has the piezoelectricity means a substrate that at least partly has the piezoelectricity. An example thereof may include a piezoelectric thin film on a surface and include a multilayer body of, for example, a film having an acoustic velocity that differs from that of the piezoelectric thin film and a support substrate. The substrate may have the piezoelectricity over the entire substrate. In this case, the substrate is a piezoelectric substrate having a single piezoelectric layer.

For example, a piezoelectricity substrate that includes a piezoelectric thin film on a surface and includes a multilayer body of, for example, a film having an acoustic velocity that differs from that of the piezoelectric thin film and a support substrate means a substrate that includes a high acoustic velocity support substrate through which a bulk wave propagates at an acoustic velocity higher than an acoustic velocity at which an acoustic wave propagates through the piezoelectric thin film, a low acoustic velocity film that is stacked on the high acoustic velocity support substrate and through which a bulk wave propagates at an acoustic velocity lower than an acoustic velocity at which a bulk acoustic wave propagates through the piezoelectric thin film, and the piezoelectric thin film that is stacked on the low acoustic velocity film. The high acoustic velocity support substrate doubles as a high acoustic velocity film and the support substrate, described later.

Other than the above, a multilayer substrate that at least partly has the piezoelectricity may be a multilayer body that includes the support substrate, the high acoustic velocity film that is formed on the support substrate and through which a bulk wave propagates at an acoustic velocity higher than an acoustic velocity at which an acoustic wave propagates through the piezoelectric thin film, the low acoustic velocity film that is stacked on the high acoustic velocity film and through which a bulk wave propagates at an acoustic velocity lower than an acoustic velocity at which a bulk acoustic wave propagates through the piezoelectric thin film, and the piezoelectric thin film that is stacked on the low acoustic velocity film.

The piezoelectric thin film is composed of a material such as $LiTaO_3$, $LiNbO_3$, ZnO, AlN, or PZT.

The low acoustic velocity film is composed of silicon oxide, glass, silicon oxynitride, tantalum oxide, a compound in which fluorine, carbon, or boron is added to silicon oxide, or a material a main component of which is any one of the above materials.

The high acoustic velocity support substrate is composed of a piezoelectric material such as aluminum nitride, aluminum oxide, silicon carbide, silicon nitride, silicon, sapphire, lithium tantalate, lithium niobate, or crystal, ceramics such as alumina, zirconia, cordierite, mullite, steatite, or forsterite, magnesia diamond, a material a main component of which is any one of the above materials, or a material a main component of which is a mixture of the above materials.

The high acoustic velocity film is composed of a DLC film, a piezoelectric material such as aluminum nitride, aluminum oxide, silicon carbide, silicon nitride, silicon, sapphire, lithium tantalate, lithium niobate, or crystal, ceramics such as alumina, zirconia, cordierite, mullite, steatite, or forsterite, magnesia diamond, a material a main component of which is any one of the above materials, or a material a main component of which is a mixture of the above materials.

The support substrate can be a substrate composed of a piezoelectric material such as sapphire, lithium tantalate, lithium niobate, or crystal, or ceramics such as alumina, magnesia, silicon nitride, aluminum nitride, silicon carbide, zirconia, cordierite, mullite, steatite, or forsterite, a dielectric material such as glass, or semiconductor such as silicon or gallium nitride, or a resin substrate.

The phase adjustment circuit 12A corresponds to a first phase adjustment circuit that is connected between the selection terminal 110a and the filter 13A and that includes one or more circuit elements. Examples of the one or more circuit elements include a capacitor, or an inductor, or both. The phase adjustment circuit 12A has a function of changing the impedance of the filter 13A viewed from the selection terminal 110a with respect to the impedance of the filter 13A viewed from the selection terminal 110a in the case where the phase adjustment circuit 12A is not added.

The phase adjustment circuit 12B corresponds to a second phase adjustment circuit that is connected between the selection terminal 110b and the filter 13B and that includes one or more circuit elements. Examples of the one or more circuit elements include a capacitor, or an inductor, or both. The phase adjustment circuit 12B has a function of changing the impedance of the filter 13B viewed from the selection terminal 110b with respect to the impedance of the filter 13B viewed from the selection terminal 110b in the case where the phase adjustment circuit 12B is not added.

The phase adjustment circuit 12C corresponds to a phase adjustment circuit that is connected between the selection terminal 110c and the filter 13C and that includes one or more circuit elements. Examples of the one or more circuit elements include a capacitor, or an inductor, or both. The phase adjustment circuit 12C has a function of changing the impedance of the filter 13C viewed from the selection terminal 110c with respect to the impedance of the filter 13C viewed from the selection terminal 110c in the case where the phase adjustment circuit 12C is not added.

With the above circuit structure, the radio frequency module 10 can simultaneously receive at least two signals among the signal in the first frequency band, the signal in the second frequency band, and the signal in the third frequency band.

For example, in the case where the signal in the first frequency band and the signal in the second frequency band are simultaneously received, the switches 11a and 11b are in a conducting state and the switch 11c is in a non-conducting state.

At least one of the one or more circuit elements that are included in the phase adjustment circuit 12A is formed on the substrate 100A. At least one of the one or more circuit elements that are included in the phase adjustment circuit 12B is formed on the substrate 100B. At least one of the one or more circuit elements that are included in the phase adjustment circuit 12C is formed on the substrate 100C.

For propagation of the signals with a low loss, for example, in a CA mode in which the signal in the first frequency band and the signal in the second frequency band are simultaneously transmitted, received, or transmitted and received, there is a need for ingenuity in the filter 13A that allows the signal in the first frequency band to pass therethrough in order to increase the impedance in the second frequency band viewed from the selection terminal 110a and for ingenuity in the filter 13B that allows the signal in the second frequency band to pass therethrough in order to increase the impedance in the first frequency band viewed from the selection terminal 110b. An effective measure is the phase adjustment of the filters 13A and 13B. For the phase adjustment, an existing phase adjustment circuit includes an inductor and a capacitor that are formed by using SMD (Surface Mounted Device) components.

With the recent introduction of a CA method, the number of the frequency bands (bands) that ought to be used in a single terminal is increased. However, there are more strict requirements for decrease in the size of a radio frequency module that is disposed at the front end of a terminal. However, phase adjustment circuits that are formed by using SMD components need to be disposed for the frequency bands. Accordingly, the increase in the number of the frequency bands (bands) causes a problem in that the size of the radio frequency module is increased.

In the radio frequency module 10 according to the present embodiment, at least one of the circuit elements that are included in the phase adjustment circuit 12A is formed on the substrate 100A on which the acoustic wave resonator of the filter 13A is formed. At least one of the circuit elements that are included in the phase adjustment circuit 12B is formed on the substrate 100B on which the acoustic wave resonator of the filter 13B is formed. At least one of the circuit elements that are included in the phase adjustment circuit 12C is formed on the substrate 100C on which the acoustic wave resonator of the filter 13C is formed. This decreases the number of circuit elements that are not formed on the substrates 100A to 100C among the circuit elements that are included in the phase adjustment circuits 12A to 12C. Accordingly, the size of the radio frequency module 10 can be decreased.

The circuit of the radio frequency module 10 according to the present embodiment described by way of example has three signal paths through which signals in three different frequency bands propagate. However, at least two paths suffice as the signal paths of the radio frequency module 10. That is, there is no need for a signal path that is defined by the switch 11c, the phase adjustment circuit 12C, and the filter 13C. The radio frequency module 10 may have four or more signal paths including an additional signal path other than the above three signal paths.

That is, the switch circuit 11 further includes a third selection terminal and a fourth selection terminal. The radio frequency module further includes the third filter that allows the signal in the third frequency band to pass therethrough, a fourth filter that allows a signal in a fourth frequency band to pass therethrough, a third phase adjustment circuit that is connected between the third selection terminal and the third filter and that includes one or more circuit elements, a fourth phase adjustment circuit that is connected between the fourth selection terminal and the fourth filter and that includes one or more circuit elements. The third filter includes a surface acoustic wave resonator that includes a third substrate that has piezoelectricity and an IDT electrode that is formed on the third substrate. The fourth filter includes a surface acoustic wave resonator that includes a fourth substrate that has piezoelectricity and an IDT electrode that is formed on the fourth substrate. At least one of the one or more circuit elements that are included in the third phase adjustment circuit is formed on the third substrate. At least one of the one or more circuit elements that are included in the fourth phase adjustment circuit is formed on the fourth substrate.

A combination of bands of LTE (Long Term Evolution) described below is taken as an example in which the radio frequency module 10 according to the present embodiment is applied to a structure having four signal paths (four different frequency bands).

(1) Band1 (reception band: 2110 to 2170 MHz), Band3 (reception band: 1805 to 1880 MHz), Band7 (reception band: 2620 to 2690 MHz), Band5 (reception band: 869 to 894 MHz)

(2) Band1, Band3, Band7, Band8 (reception band: 925 to 960 MHz)

(3) Band1, Band3, Band7, Band20 (reception band: 791 to 821 MHz)

(4) Band1, Band3, Band7, Band40 (band: 2300 to 2400 MHz)

(5) Band2 (reception band: 1930 to 1990 MHz), Band4 (reception band: 2110 to 2155 MHz), Band30 (reception band: 2350 to 2360 MHz), Band5

(6) Band2, Band4, Band30, Band29 (reception band: 717 to 728 MHz)

(7) Band2, Band4, Band30, Band12 (reception band: 729 to 746 MHz)

With the above structure, an insertion loss when two or more bands of four bands of LTE are used in the CA mode is reduced, and the size of the radio frequency module can be decreased.

Components of the front end module 20 and the communication device 5 other than the radio frequency module 10 will now be described.

The reception amplifier circuit 21A is a low-noise amplifier that amplifies the power of the signal in the first frequency band inputted via the antenna element 2 and a reception signal path defined by the switch circuit 11, the phase adjustment circuit 12A, and the filter 13A, and that outputs the signal to the RFIC 3. The reception amplifier circuit 21B is a low-noise amplifier that amplifies the power of the signal in the second frequency band inputted via the antenna element 2 and a reception signal path defined by the switch circuit 11, the phase adjustment circuit 12B, and the filter 13B, and that outputs the signal to the RFIC 3. The reception amplifier circuit 21C is a low-noise amplifier that amplifies the power of the signal in the third frequency band inputted via the antenna element 2 and a reception signal path defined by the switch circuit 11, the phase adjustment circuit 12C, and the filter 13C, and that outputs the signal to the RFIC 3.

The RFIC 3 processes reception radio frequency signals that are inputted from the antenna element 2 via the three reception signal paths by, for example, down-converting and outputs a reception signal that is generated by processing the signals to the BBIC 4. The RFIC 3 processes a transmission signal that is inputted from the BBIC 4 by, for example, up-converting and outputs a transmission radio frequency signal that is generated by processing the signal to a transmission amplifier circuit (not illustrated in FIG. 1). The signal that is processed by the BBIC 4 is used, for example, as an image signal for image display or as an audio signal for telecommunication.

[1.2 Circuit Element Mounting Configuration of Radio Frequency Module]

Mounting configurations of the circuit elements that are included in the radio frequency module 10 will now be described.

Figure 2A:
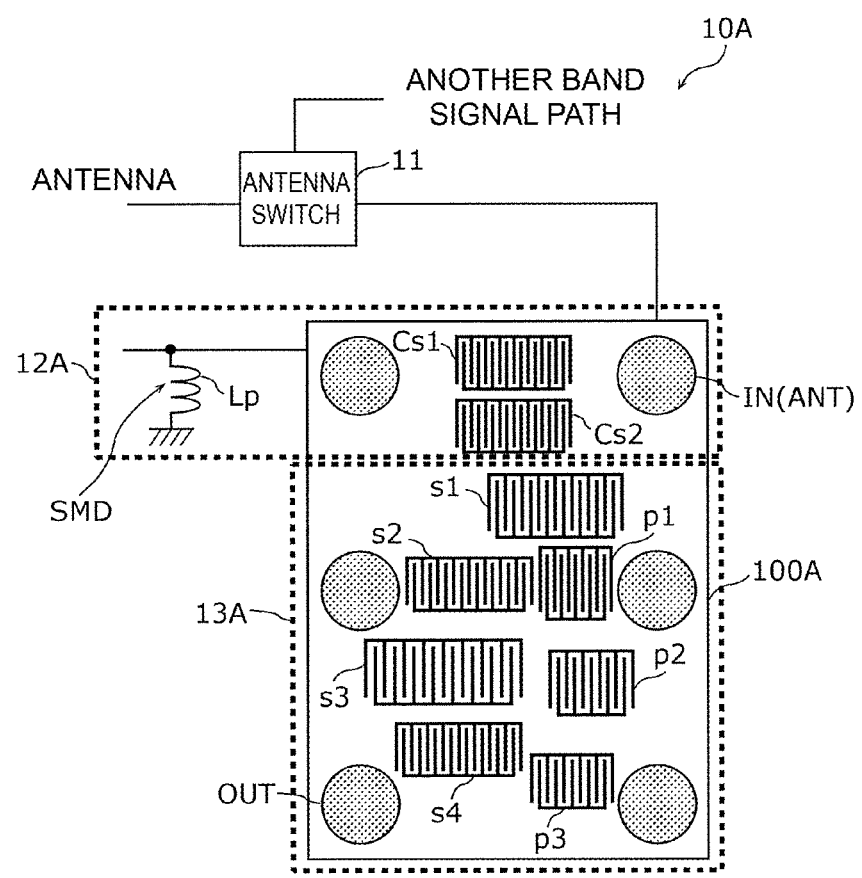
FIG. 2A illustrates arrangement of a filter and a phase adjustment circuit that are included in a radio frequency module in a first example.

FIG. 2A illustrates arrangement of the filter 13A and the phase adjustment circuit 12A that are included in a radio frequency module 10A in a first example. The circuit structure of the radio frequency module 10A in the first example is the same as that of the radio frequency module 10 according to the embodiment and corresponds to the embodied mounting configurations of the radio frequency module 10. FIG. 2A illustrates the mounting configurations of the filter 13A and the phase adjustment circuit 12A among the mounting configurations of the radio frequency module 10A in the first example.

The radio frequency module 10A in the first example includes, for example, a multilayer substrate on which the switch circuit 11, the phase adjustment circuits 12A to 12C, and the filters 13A to 13C are mounted.

The switch circuit 11 includes a switch IC that includes, for example, FETs (Field Effect Transistors) and a wiring line and is mounted on a surface of the multilayer substrate or in the multilayer substrate.

The filters 13A, 13B, and 13C are formed on the substrates 100A, 100B, and 100C that have piezoelectricity. The filter 13A is a surface acoustic wave filter that includes a surface acoustic wave resonator that includes the substrate 100A and an IDT electrode that is formed on the substrate 100A. The filter 13B is a surface acoustic wave filter that includes a surface acoustic wave resonator that includes the substrate 100B and an IDT electrode that is formed on the substrate 100B. The filter 13C is a surface acoustic wave filter that includes a surface acoustic wave resonator that includes the substrate 100C and an IDT electrode that is formed on the substrate 100C. As illustrated in FIG. 2A, the filter 13A is a ladder surface acoustic wave filter that includes, for example, series arm resonators s1, s2, s3, and s4 and parallel arm resonators p1, p2, and p3. The filters 13A, 13B, and 13C may have a ladder structure or a longitudinally coupled structure provided that each of the filters 13A, 13B, and 13C is a surface acoustic wave filter that includes a surface acoustic wave resonator that includes a substrate that has piezoelectricity and an IDT electrode that is formed on the substrate.

The substrate 100A on which the filter 13A is formed, the substrate 100B on which the filter 13B is formed, and the substrate 100C on which the filter 13C is formed are mounted, for example, on the multilayer substrate.

The phase adjustment circuit 12A includes, for example, capacitors Cs1 and Cs2 that are connected to each other in series on a path connecting the selection terminal 110a and the filter 13A to each other, and an inductor Lp that is connected to the ground and a connection node of the capacitors Cs1 and Cs2.

Among the capacitors Cs1 and Cs2 and the inductor Lp that are included in the phase adjustment circuit 12A, the capacitors Cs1 and Cs2 are formed on the substrate 100A. Consequently, among the circuit elements that are included in the phase adjustment circuit 12A, the inductor Lp is the only circuit element that is not formed on the substrate 100A. The inductor Lp that is not formed on the substrate 100A is formed, for example, in the multilayer substrate as a planer coil or on a surface of the multilayer substrate as a SMD component.

As illustrated in FIG. 2A, the capacitors Cs1 and Cs2 may include comb teeth capacitance electrodes that are formed on the substrate 100A. This enables the capacitors Cs1 and Cs2 to be formed in the same manufacturing process as a manufacturing process in which the IDT electrode of the filter 13A is manufactured, and the manufacturing process can be simplified.

Among the capacitors Cs1 and Cs2 and the inductor Lp that are included in the phase adjustment circuit 12A, the inductor Lp may be formed on the substrate 100A.

Figure 2B:
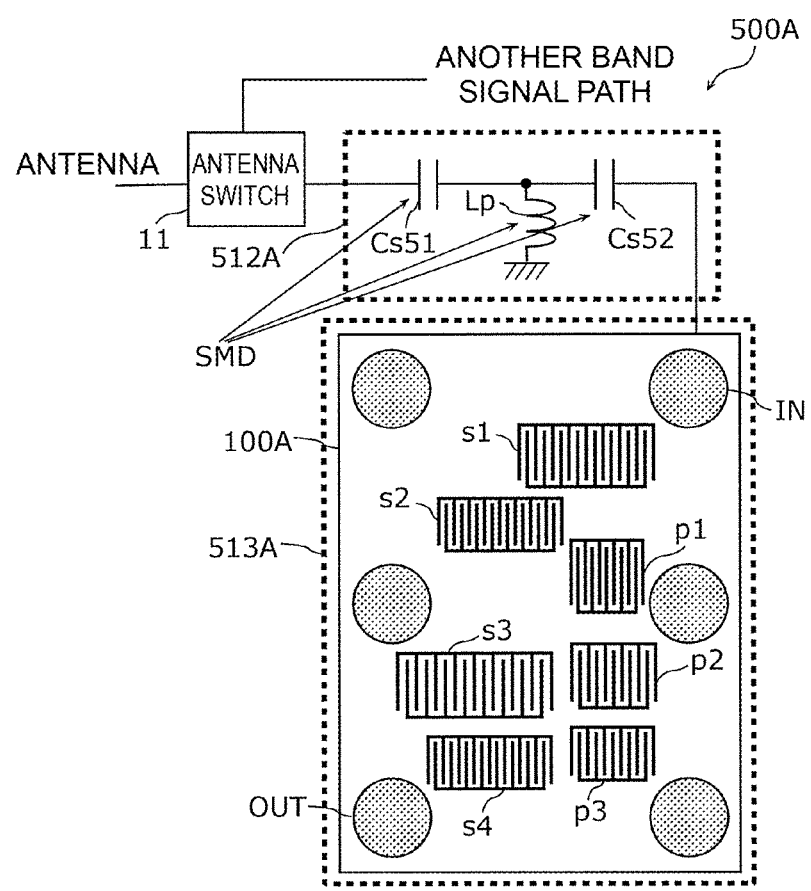
FIG. 2B illustrates arrangement of a filter and a phase adjustment circuit that are included in a radio frequency module in a comparative example.

FIG. 2B illustrates arrangement of a filter 513A and a phase adjustment circuit 512A that are included in a radio frequency module 500A in a comparative example. The circuit structure of the radio frequency module 500A in the comparative example is the same as that of the radio frequency module 10 according to the embodiment and corresponds to the embodied mounting configurations of the radio frequency module 10. FIG. 2B illustrates the mounting configurations of the filter 513A and the phase adjustment circuit 512A among the mounting configurations of the radio frequency module 500A in the comparative example. The mounting configurations of the radio frequency module 500A in the comparative example differ from those of the radio frequency module 10A in the first example in that the filter 13A is replaced with the filter 513A, the phase adjustment circuit 12A is replaced with the phase adjustment circuit 512A, all of the circuit elements that are included in the phase adjustment circuit 512A are not formed on the substrate 100A.

The phase adjustment circuit 512A includes capacitors Cs51 and Cs52 that are connected to each other in series on a path connecting the selection terminal 110a and the filter 513A to each other and the inductor Lp that is connected to the ground and a connection node of the capacitors Cs51 and Cs52. All of the capacitors Cs51 and Cs52 and the inductor Lp that are included in the phase adjustment circuit 512A are not formed on the substrate 100A. The inductor Lp that is not formed on the substrate 100A is formed, for example, in a multilayer substrate as a planer coil or on a surface of the multilayer substrate as a SMD component. The capacitors Cs51 and Cs52 that are not formed on the substrate 100A are formed, for example, in the multilayer substrate as electrodes that face each other with a dielectric layer interposed therebetween or on a surface of the multilayer substrate as SMD components.

The mounting configurations of the radio frequency module 10A in the first example and the mounting configurations of the radio frequency module 500A in the comparative example are compared. The substrates 100A on which the filters 13A and 513A are formed are used (with the same size) for both of the radio frequency module 10A and 500A because an electrode connection layout of the substrate 100A and the multilayer substrate is fixed. However, all of the capacitors Cs51 and Cs52 and the inductor Lp that are included in the phase adjustment circuit 512A are formed on the multilayer substrate other than the substrate 100A. Among the capacitors Cs1 and Cs2 and the inductor Lp that are included in the phase adjustment circuit 12A, only the inductor Lp is formed on the multilayer substrate other than the substrate 100A.

From the above comparison, a space required for mounting the filter 13A and the phase adjustment circuit 12A of the radio frequency module 10A is smaller than a space required for mounting the filter 513A and the phase adjustment circuit 512A of the radio frequency module 500A.

It is preferable that the capacitors be formed on the substrate 100A among the inductor and the capacitors that are included in the phase adjustment circuit 12A. The area of the radio frequency module 10A can be effectively decreased in a manner in which the inductor Lp is not formed on the substrate 100A and the capacitors Cs1 and Cs2 are formed thereon.

FIG. 2C illustrates comparison between the layouts of the radio frequency module 10A in the first example and the radio frequency module 500A in the comparative example. A planer layout of the filter 13A and the phase adjustment circuit 12A of the radio frequency module 10A in the first example is illustrated on the left side in FIG. 2C. A planer layout of the filter 513A and the phase adjustment circuit 512A of the radio frequency module 500A in the comparative example is illustrated on the right side in FIG. 2C.

The size of the substrates 100A on which the filters 13A and 513A are formed is, for example, 0.6 mm in width and 0.8 mm in length, and the radio frequency modules 10A and 500A have the size in common. The size of each of the inductor Lp and the capacitors Cs51 and Cs52 that are included in the phase adjustment circuits 12A and 512A is, for example, 0.4 mm in width and 0.2 mm in length in the case of a SMD component.

When each circuit element has the above size, a mounting area A1 for the filter 13A and the phase adjustment circuit 12A of the radio frequency module 10A is smaller than a mounting area A500 for the filter 513A and the phase adjustment circuit 512A of the radio frequency module 500A.

In the above description, the mounting areas for the filter 13A (513A) and the phase adjustment circuit 12A (512A) that are disposed on the signal path through which the signal in the first frequency band (BandA) propagates are compared. A similar comparison result is obtained for the signal path through which the signal in the second frequency band (BandB) propagates, and the signal path through which the signal in the third frequency band (BandC) propagates. Accordingly, the mounting area of the entire radio frequency module 10A can be smaller than the mounting area of the entire radio frequency module 500A, and the size of the radio frequency module can be decreased.

[1.3 Signal Bandpass Characteristics of Radio Frequency Module]

Before describing the signal bandpass characteristics of the radio frequency module 10 according to the present embodiment, the signal bandpass characteristics of a circuit in which two filters (the Band1 filter and the Band1 filter) having different pass bands are connected to a common terminal will be described.

Figure 3A:
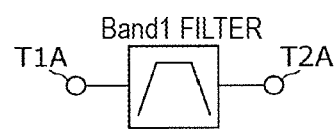
FIGS. 3A, 3B and 3C illustrate bandpass characteristics in the case where a phase is sufficiently adjusted in a circuit in which a Band1 filter and a Band1 filter are connected to a common terminal.
Figure 3A:
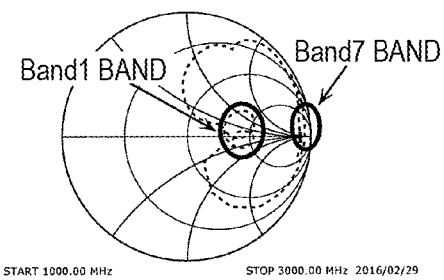
Figure 3B:
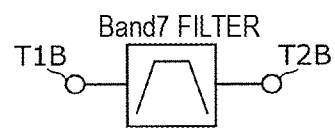
Figure 3B:
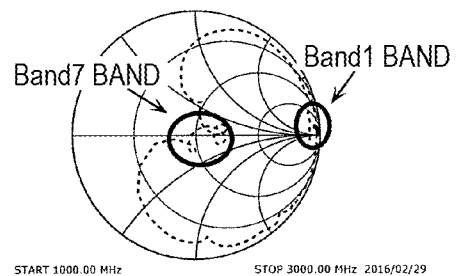
Figure 3C:
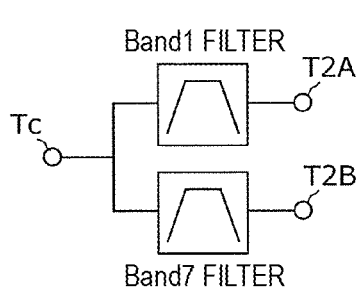
Figure 3C:
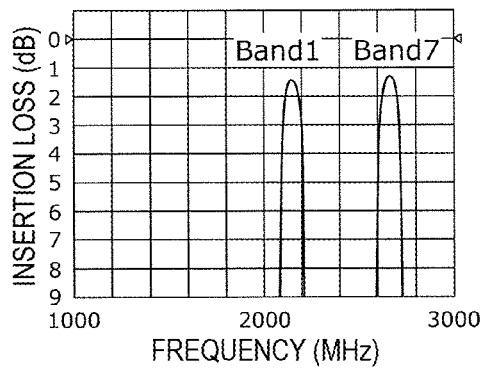

FIGS. 3A, 3B and 3C illustrate bandpass characteristics in the case where a phase is sufficiently adjusted in a circuit in which the Band1 filter and the Band7 filter are connected to a common terminal Tc. In FIG. 3A, a Smith chart representing the impedance characteristics of the Band1 filter itself is illustrated. In FIG. 3B, a Smith chart representing the impedance characteristics of the Band7 filter itself is illustrated. In FIG. 3C, the bandpass characteristics of the circuit in which the Band1 filter and the Band7 filter are connected to the common terminal Tc are illustrated.

In FIG. 3A, the impedance viewed from a terminal T1A of the Band1 filter is illustrated. The impedance in the pass band (Band1 band) is close to a characteristic impedance (50Ω). The impedance in a partner band (Band7 band) is close to a high impedance (open).

In FIG. 3B, the impedance viewed from a terminal T1B of the Band7 filter is illustrated. The impedance in the pass band (Band7 band) is the characteristic impedance (50Ω). The impedance in the partner band (Band1 band) is close to a high impedance (open).

FIG. 3C illustrates the bandpass characteristics in the case where the circuit in which the Band1 filter and the Band7 filter that have the above characteristics are connected to the common terminal Tc is used in the CA mode for simultaneous reception in Band1 and Band7. The loss is low in the pass band of Band1 and the pass band of Band7. The reason why the loss can be low in the CA mode of Band1 and Band7 is as follows.

A reflection coefficient in the Band7 band viewed from the terminal T1A of the Band1 filter can be increased by bringing the impedance in Band7 viewed from the terminal T1A of the Band1 filter close to that in an open state (FIG. 3A). This enables a leak of the signal in the Band7 band to the Band1 filter to be minimized and enables the pass band insertion loss of the Band7 filter to be reduced. A reflection coefficient in the Band1 band viewed from the terminal T1B of the Band7 filter can be increased by bringing the impedance in Band1 viewed from the terminal T1B of the Band7 filter close to that in the open state (FIG. 3B). This enables a leak of the signal in the Band1 band to the Band7 filter to be minimized and enables the pass band insertion loss of the Band1 filter to be reduced.

That is, the loss can be low in the CA mode of Band1 and Band7 in a manner in which the impedance in the pass band is matched to the characteristic impedance in the Band1 filter and the Band7 filter, and the impedance in the partner band is matched to that in the open state.

Figure 3D:
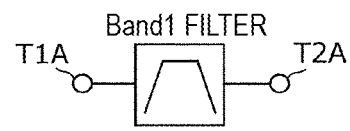
FIGS. 3D, 3E and 3F illustrate bandpass characteristics in the case where the phase is insufficiently adjusted in the circuit in which the Band1 filter and the Band1 filter are connected to the common terminal.
Figure 3D:
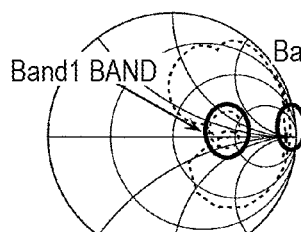
Figure 3E:
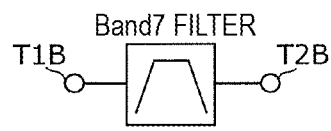
Figure 3E:
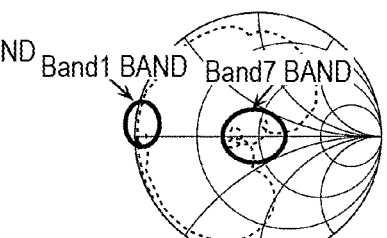
Figure 3F:
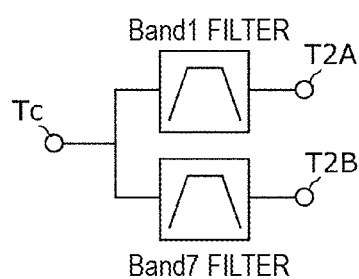
Figure 3F:
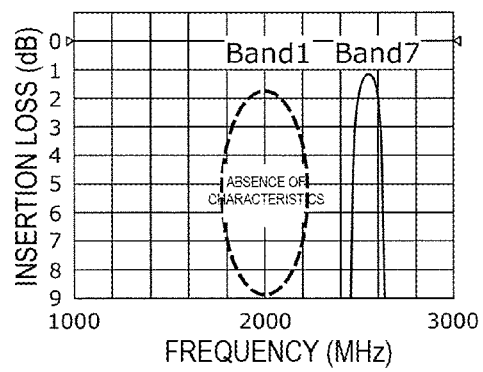

FIGS. 3D, 3E and 3F illustrate the bandpass characteristics in the case where the phase is insufficiently adjusted in the circuit in which the Band1 filter and the Band7 filter are connected to the common terminal Tc. In FIG. 3D, a Smith chart representing the impedance characteristics of the Band1 filter itself is illustrated. In FIG. 3E, a Smith chart representing the impedance characteristics of the Band7 filter itself is illustrated. In FIG. 3F, the bandpass characteristics of the circuit in which the Band1 filter and the Band7 filter are connected to the common terminal Tc are illustrated.

In FIG. 3D, the impedance viewed from the terminal T1A of the Band1 filter is illustrated. The impedance in the pass band (Band1 band) is close to the characteristic impedance (50Ω), and the impedance in the partner band (Band7 band) is close to a high impedance (open).

In FIG. 3E, the impedance viewed from the terminal T1B of the Band7 filter is illustrated. The impedance in the pass band (Band7 band) is the characteristic impedance (50Ω). The impedance in the partner band (Band1 band) is close to a low impedance (short circuit).

FIG. 3F illustrates the bandpass characteristics in the case where the circuit in which the Band1 filter and the Band7 filter that have the above characteristics are connected to the common terminal Tc is used in the CA mode for simultaneous reception in Band1 and Band7. The loss is low in the pass band of Band7. However, the loss is not low in the pass band of Band1 (absence of characteristics). The reason why the loss in Band1 is not low in the CA mode of Band1 and Band7 is as follows.

The reflection coefficient in the Band7 band viewed from the terminal T1A of the Band1 filter can be increased by bringing the impedance in Band7 viewed from the terminal T1A of the Band1 filter close to that in the open state (FIG. 3D). This enables the leak of the signal in the Band7 band to the Band1 filter to be minimized and enables the pass band insertion loss of the Band7 filter to be reduced. The reflection coefficient in the Band1 band viewed from the terminal T1B of the Band7 filter is decreased with the impedance in Band1 viewed from the terminal T1B of the Band7 filter being close to that in a short circuit state (FIG. 3E). This increases the amount of the leak of the signal in the Band1 band to the Band7 filter and degrades the pass band insertion loss of the Band1 filter.

Figure 4:
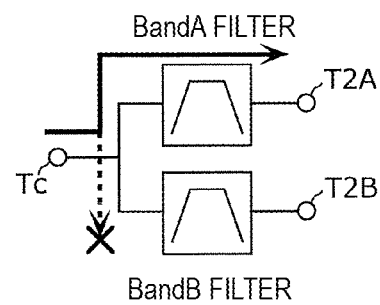
FIG. 4 illustrates a graph representing a relationship between a CA partner band impedance and the degree of degradation in an insertion loss in a circuit in which a BandA filter and a BandB filter are connected to the common terminal.
Figure 4:
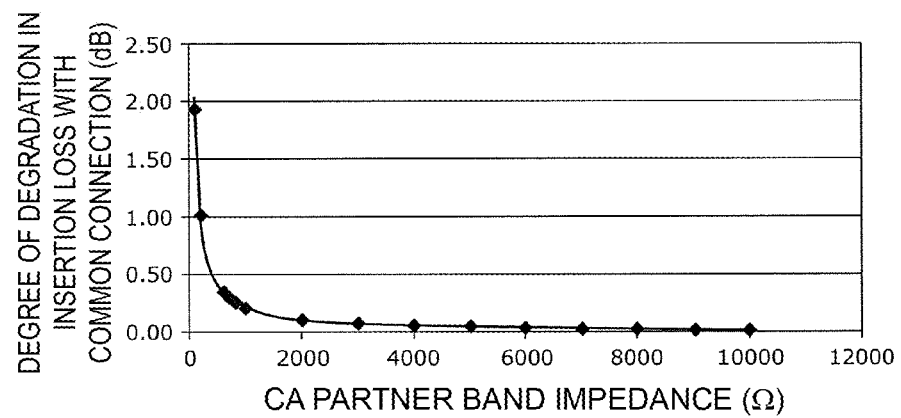

FIG. 4 illustrates a graph representing a relationship between a CA partner band impedance and the degree of degradation in the insertion loss in the circuit in which the BandA filter and the BandB filter are connected to the common terminal Tc. More specifically, the horizontal axis of the graph in FIG. 4 represents the absolute value of the impedance (CA partner band impedance) in the BandA band when the BandB filter alone is viewed from the terminal Tc. The vertical axis thereof represents the degree of degradation in the insertion loss of the BandA filter in the CA mode with respect to the insertion loss of the BandA filter itself.

In the graph in FIG. 4, the degree of degradation in the insertion loss of the BandA filter is 0.1 dB or less when the CA partner band impedance is a high impedance of 2 kΩ or more. The degree of degradation in the insertion loss of the BandA filter is 0.1 dB or more when the CA partner band impedance is a low impedance of 1 kΩ or less. As the CA partner band impedance is closer to a low impedance, the degree of degradation in the insertion loss of the BandA filter sharply increases.

The following description includes a structure for bringing the CA partner band impedance close to a high impedance (that in the open state) while the own band impedances of the filters 13A, 13B, and 13C in the CA mode are kept close to the characteristic impedance in the radio frequency module 10 according to the present embodiment. In the following description, the pass band of the filter 13A that is included in the radio frequency module 10 according to the present embodiment is Band1, the pass band of the filter 13B is Band7, the pass band of the filter 13C is Band3, and the CA mode of Band1 and Band7 is used.

FIGS. 5A, 5B, 5C, 5D and 5E illustrate Smith charts representing the impedance when the filter 13A is viewed from nodes X1, X2, X3, and X4 of the phase adjustment circuit 12A.

The phase adjustment circuit 12A includes, for example, the capacitor Cs1 (seventh circuit element) that is disposed on the path connecting the selection terminal 110a and the filter 13A to each other, an inductor Lp1 (eighth circuit element) that is disposed between the ground and a connection node of the selection terminal 110a and the capacitor Cs1, and an inductor Lp2 (ninth circuit element) that is disposed between the ground and a connection node of the capacitor Cs1 and the filter 13A.

Similarly, the phase adjustment circuit 12B (not illustrated) includes, for example, a tenth circuit element that is disposed on a path connecting the selection terminal 110b and the filter 13B to each other, an eleventh circuit element that is disposed between the ground and a connection node of the selection terminal 110b and the tenth circuit element, and a twelfth circuit element that is disposed between the ground and a connection node of the tenth circuit element and the filter 13B.

An example of the filter 13A is a surface acoustic wave filter. Accordingly, as illustrated in FIG. 5B, the impedance of the filter 13A itself viewed from the node X1 in the own band (Band1) is close to the characteristic impedance (50Ω), and the impedance thereof in the CA partner band (Band1) is capacitive. Here, the impedance is changed by each circuit element of the phase adjustment circuit 12A.

The inductor Lp2 is first arranged at the node X1 in parallel with the filter 13A. Consequently, as illustrated in FIG. 5C, the impedance of the filter 13A viewed from the node X2 overall shifts counterclockwise.

Furthermore, the capacitor Cs1 is arranged at the node X2 in series with the filter 13A and the inductor Lp2.

Consequently, as illustrated in FIG. 5D, the impedance of the filter 13A viewed from the node X3 in the own band (Band1) shifts to a capacitive one, and the impedance thereof in an attenuation band shifts counterclockwise.

Furthermore, the inductor Lp1 is arranged at the node X3 in parallel with the filter 13A, the inductor Lp2, and the capacitor Cs1. Consequently, as illustrated in FIG. 5E, the impedance of the filter 13A viewed from the node X4 overall shifts counterclockwise.

Through the above stepwise changes in the impedance, as illustrated in FIG. 5E, the impedance of the filter 13A viewed from the node X4 in the own band (Band1) can be close to the characteristic impedance (50Ω), and the impedance thereof in the CA partner band (Band7) can be close to a high impedance (open).

Regarding the filter 13B, the impedance in the own band (Band7) can be close to the characteristic impedance (50Ω), and the impedance in the CA partner band (Band1) can be close to a high impedance (open) as the impedance of the filter 13A is changed as above.

The radio frequency module 10 according to the present embodiment improves the bandpass characteristics of the signal in the first frequency band (for example, Band1) and the signal in the second frequency band (for example, Band7) in the CA mode.

That is, the impedance in the first frequency band (for example, Band1) viewed from the selection terminal 110b of the filter 13B can be shifted to that in the open state (the reflection coefficient in the first frequency band viewed from the selection terminal 110b of the filter 13B can be increased) by adjusting the phase of the filter 13B by using the phase adjustment circuit 12B. This enables a leak of the signal in the first frequency band (for example, Band1) to the filter 13B to be minimized and enables the pass band insertion loss of the filter 13A to be reduced.

In addition, the impedance in the second frequency band (for example, Band7) viewed from the selection terminal 110a of the filter 13A can be shifted to that in the open state (the reflection coefficient in the second frequency band viewed from the selection terminal 110a of the filter 13A can be increased) by adjusting the phase of the filter 13A by using the phase adjustment circuit 12A. This enables a leak of the signal in the second frequency band (for example, Band7) to the filter 13A to be minimized and enables the pass band insertion loss of the filter 13B to be reduced.

Furthermore, the number of circuit elements that are formed on neither the substrate 100A nor the substrate 100B can be decreased among the circuit elements that are included in the phase adjustment circuits 12A and 12B because the circuit elements (for example, the capacitors Cs1 and Cs2) that are included in the phase adjustment circuit 12A are formed on the substrate 100A on which the acoustic wave resonator of the filter 13A is formed, and the circuit elements that are included in the phase adjustment circuit 12B are formed on the substrate 100B on which the acoustic wave resonator of the filter 13B is formed. Accordingly, the insertion loss in the CA mode is reduced, and the size of the radio frequency module 10 can be decreased.

In the above circuit structure of the phase adjustment circuit 12A, the capacitor is disposed on the path connecting the selection terminal 110a and the filter 13A to each other, and the inductors are disposed between the nodes on the path and the ground. However, the circuit structure may be such that the inductors are disposed on the path, and the capacitor is disposed between one of the nodes on the path and the ground. Selection of the above circuit structures may be decided depending on the impedance characteristics of the filter 13A.

The impedance of each filter can be changed clockwise on the Smith chart by arranging the inductors in series on the path and arranging the capacitor in parallel between the node on the path and the ground. The impedance of the filter can be changed counterclockwise on the Smith chart by arranging the capacitor in series on the path and arranging the inductors in parallel between the nodes on the path and the ground.

The circuit structure of the phase adjustment circuit 12A is described, by way of example, as a so-called $\pi c$-type circuit structure that includes the capacitor and the inductors but may be a T-type circuit structure.

That is, the phase adjustment circuit 12A may include a first circuit element and a second circuit element that are disposed on the path connecting the selection terminal 110a and the filter 13A to each other and that are connected to each other in series, and a third circuit element that is disposed between the ground and a connection node of the first circuit element and the second circuit element.

The phase adjustment circuit 12B may include a fourth circuit element and a fifth circuit element that are disposed on the path connecting the selection terminal 110b and the filter 13B to each other and that are connected to each other in series, and a sixth circuit element that is disposed between the ground and a connection node of the fourth circuit element and the fifth circuit element.

The above phase adjustment circuits 12A and 12B enable the phase to be shifted stepwise at the connection nodes X1 to X4 of the circuit elements, and appropriate selection of the above circuit structures improves the extensibility of phase adjustment. Appropriate selection of the inductors or the capacitors achieves low-bandpass characteristics and high-bandpass characteristics in addition to the filter characteristics of the filters. For example, spurious emission in a low attenuation band and a high attenuation band of the pass band can be reduced.

Each of the first circuit element to the twelfth circuit element may be an inductor or a capacitor.

[1.4 Structure of Capacitor of Comb Teeth Capacitance Type Formed on Substrate]

In the radio frequency module 10A in the first example, as illustrated in FIG. 2A, the capacitors Cs1 and Cs2 include the comb teeth capacitance electrodes that are formed on the substrate 100A. The capacitors Cs1 and Cs2 that include the comb teeth capacitance electrodes on the substrate 100A enable the size of the radio frequency module 10A to be decreased. However, the capacitors Cs1 and Cs2 that include the comb teeth capacitance electrodes and the substrate 100A have an anti-resonant frequency at which the impedance is the maximum and a resonant frequency at which the impedance is the minimum.

Figure 6:
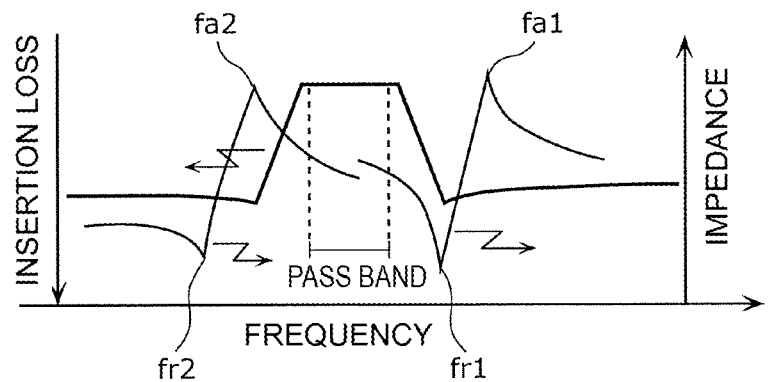
FIG. 6 illustrates a relationship between the bandpass characteristics of the filter and the impedance characteristics of a comb teeth capacitance.

FIG. 6 illustrates a relationship between the bandpass characteristics of the filter 13A and the impedance characteristics of the capacitors Cs1 and Cs2. As illustrated in the figure, the resonant frequencies fr1 and fr2 and the anti-resonant frequencies fa1 and fa2 of the capacitors Cs1 and Cs2 are preferably lower or higher than those in the pass band (first frequency band) of the filter 13A.

This eliminates unnecessary spurious emission, which appears as a filter characteristic due to the resonance point and the anti-resonance point of the capacitors Cs1 and Cs2, in the pass band of the filter. Accordingly, the loss can be kept low in the pass band of the filter 13A. Also, regarding the filter 13B, the loss can be kept low in the pass band of the filter 13B with the resonant frequency and the anti-resonant frequency of the capacitors being lower or higher than those in the pass band (second frequency band) of the filter 13B.

Figure 7A:
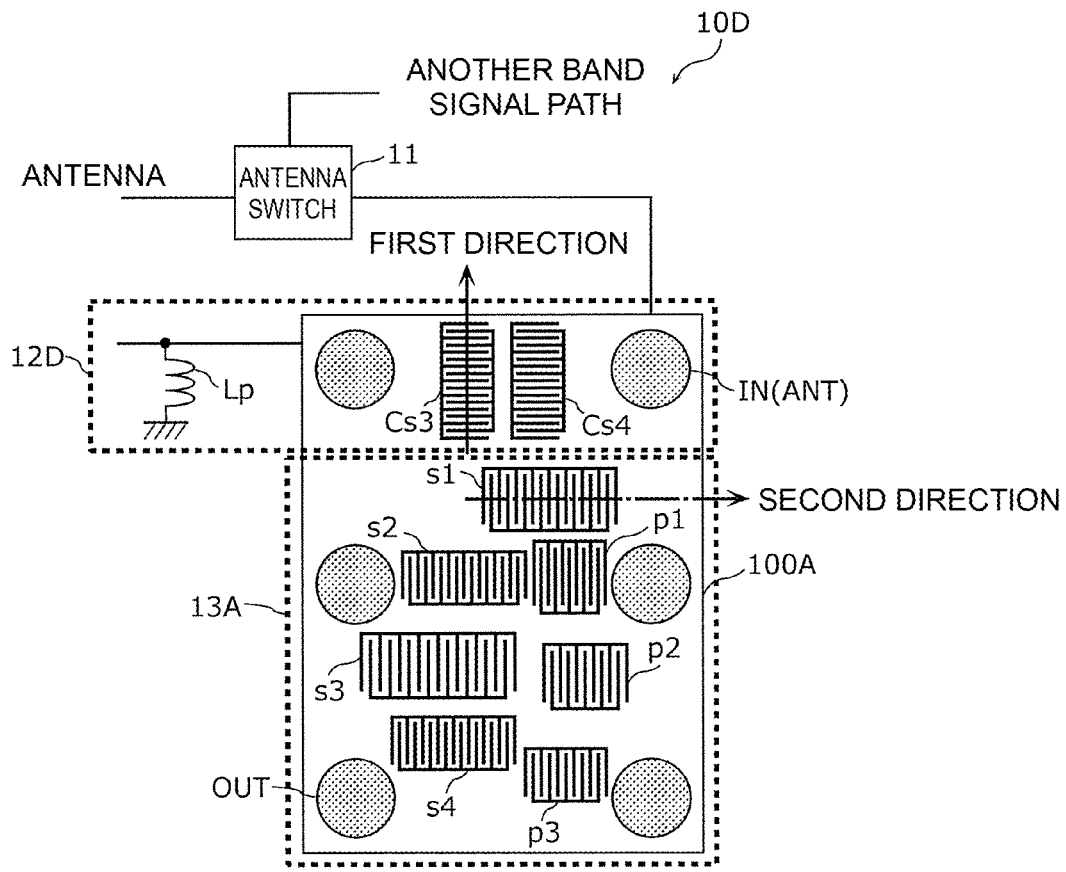
FIG. 7A illustrates arrangement of the filter and a phase adjustment circuit that are included in a radio frequency module in a second example.

FIG. 7A illustrates arrangement of the filter 13A and a phase adjustment circuit 12D that are included in a radio frequency module 10D in a second example. The radio frequency module 10D in the second example illustrated in the figure differs from the radio frequency module 10A in the first example in that capacitors that are included in the phase adjustment circuit are arranged in a different manner. In the following description, the same matters as in the radio frequency module 10A in the first example are omitted, and the differences between the radio frequency module 10D in the second example and the radio frequency module 10A in the first example are mainly described.

The phase adjustment circuit 12D includes, for example, capacitors Cs3 and Cs4 that are connected to each other in series on the path connecting the selection terminal 110a and the filter 13A to each other and the inductor Lp that is connected to the ground and a connection node of the capacitors Cs3 and Cs4.

Among the capacitors Cs3 and Cs4 and the inductor Lp that are included in the phase adjustment circuit 12D, the capacitors Cs3 and Cs4 are formed on the substrate 100A. As illustrated in FIG. 7A, the capacitors Cs3 and Cs4 include comb teeth capacitance electrodes that are formed on the substrate 100A.

In a plan view of the substrate 100A, a first direction perpendicular to electrode fingers that are included in the comb teeth capacitance electrodes of the capacitors Cs3 and Cs4 and that are parallel to each other differs from a second direction perpendicular to electrode fingers that are included in the IDT electrode of the filter 13A and that are parallel to each other.

Figure 7B:
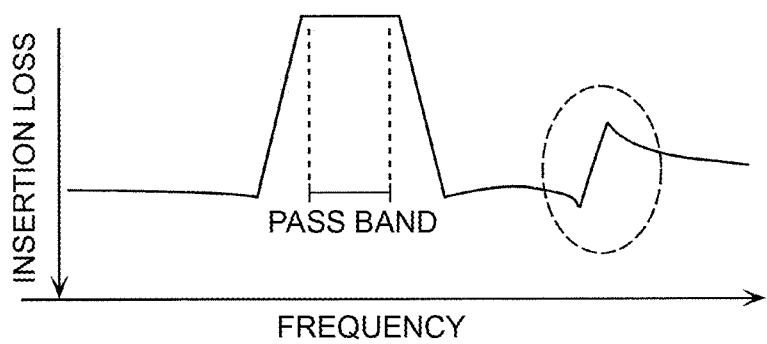
FIGS. 7B and 7C illustrate comparison between the bandpass characteristics of the filters and the phase adjustment circuits that are included in the radio frequency modules in the first example and the second example.
Figure 7C:
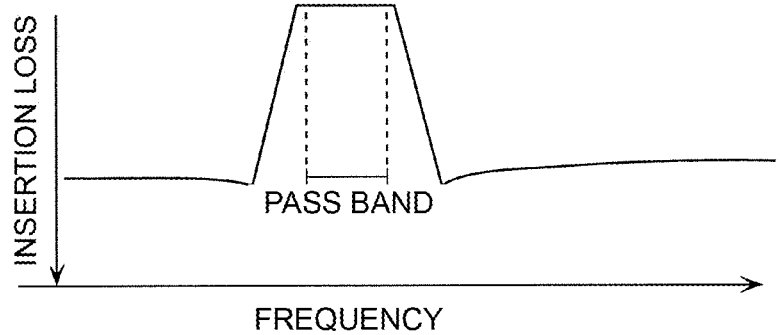

FIGS. 7B and 7C illustrate comparison between the bandpass characteristics of the filters and the phase adjustment circuits that are included in the radio frequency modules in the first example and the second example. In FIG. 7B, the bandpass characteristics of the filter 13A and the phase adjustment circuit 12A that are included in the radio frequency module 10A in the first example are illustrated. In FIG. 7C the bandpass characteristics of the filter 13A and the phase adjustment circuit 12D that are included in the radio frequency module 10D in the second example are illustrated.

In the radio frequency module 10A in the first example, a direction in which a spurious wave due to excitation of the comb teeth capacitance electrodes of the capacitors Cs1 and Cs2 propagates coincides with a direction in which an acoustic wave due to excitation of the IDT electrode of the filter 13A propagates. Accordingly, as illustrated in FIG. 7B, unnecessary spurious emission overlaps a signal that passed through the filter 13A in some cases.

In the radio frequency module 10D in the second example, however, a direction in which a spurious wave due to excitation of the comb teeth capacitance electrodes of the capacitors Cs3 and Cs4 propagates differs from a direction in which an acoustic wave due to excitation of the IDT electrode of the filter 13A propagates. Accordingly, the spurious wave can be inhibited from interfering with the acoustic wave due to excitation of the IDT electrode of the filter 13A. Consequently, unnecessary spurious emission can be inhibited from overlapping the signal that passes through the filter 13A.

In a plan view of the substrate 100A, the first direction perpendicular to the electrode fingers that are included in the comb teeth capacitance electrodes of the capacitors Cs3 and Cs4 and that are parallel to each other is preferably perpendicular to the second direction perpendicular to the electrode fingers that are included in the IDT electrode of the filter 13A and that are parallel to each other. This most effectively inhibits the unnecessary spurious emission from overlapping the signal that passes through the filter 13A.

Figure 8:
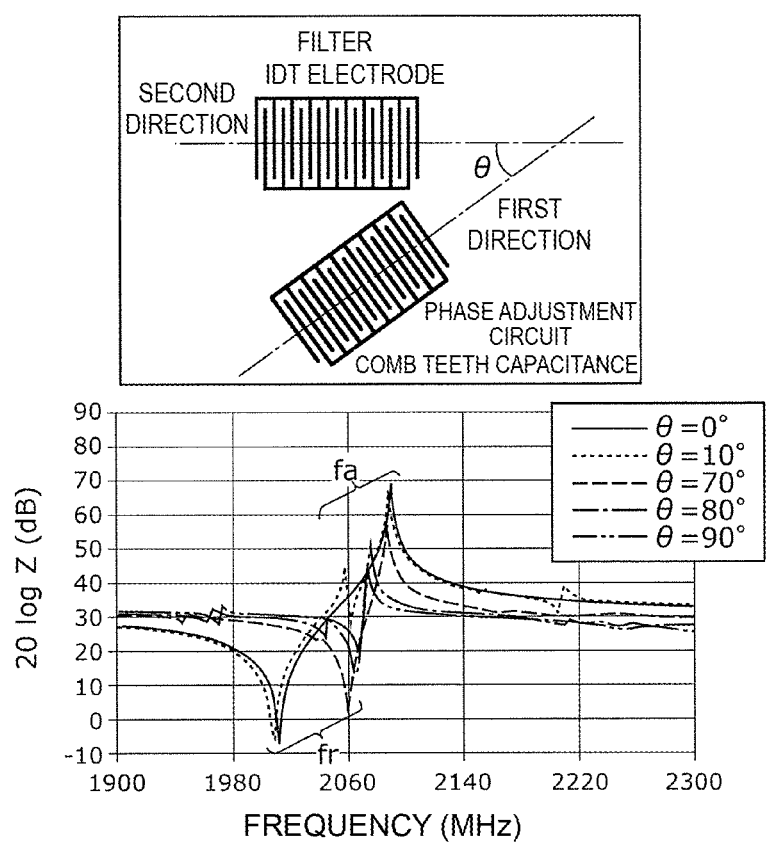
FIG. 8 illustrates a graph representing the impedance of a comb teeth capacitance in the case where an angle that is formed between an IDT electrode and comb teeth capacitance electrodes of the radio frequency module in the second example is changed.

FIG. 8 illustrates a graph representing the impedance of a comb teeth capacitance in the case where an angle that is formed between an IDT electrode and comb teeth capacitance electrodes of the radio frequency module 10D in the second example is changed. The figure illustrates the impedance characteristics of the capacitors Cs3 and Cs4 (comb teeth capacitance) that are included in the phase adjustment circuit in the case where an angle θ that is formed between the first direction and the second direction is changed. As illustrated in the figure, as the angle θ changes from 0° to 90°, the impedance of the anti-resonant frequency fa decreases, and the impedance of the resonant frequency fr increases. That is, as the angle θ changes from 0° to 90°, a variation in the impedance of the comb teeth capacitance can be decreased.

The angle θ is preferably 80° or more to keep the impedance of the anti-resonant frequency fa 20 dB or more lower than the impedance of the anti-resonant frequency fa when the angle θ is 0° and to keep the impedance of the resonant frequency fr 20 dB or more larger than the impedance of the resonant frequency fr when the angle θ is 0°. That is, when the angle θ is no less than 80° and no more than 100°, peculiar behavior of the comb teeth capacitance at the anti-resonance point and at the resonance point can be regulated. This effectively inhibits the unnecessary spurious emission from overlapping the signal that passes through the filter.

[1.5 Common Structure of Filter Resonator and Phase Adjustment Circuit Capacitor in Third Example]

Figure 9A:
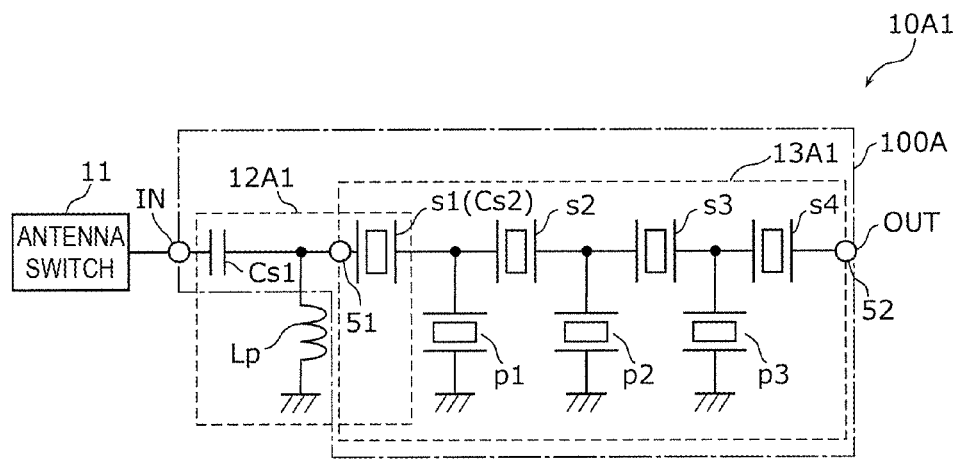
FIG. 9A illustrates the structure of a filter and a phase adjustment circuit that are included in a radio frequency module in a third example.

FIG. 9A illustrates the structure of a filter 13A1 and a phase adjustment circuit 12A1 that are included in a radio frequency module 10A1 in a third example. The circuit structure of the radio frequency module 10A1 in the present example is the same as that of the radio frequency module 10 illustrated in FIG. 1. The radio frequency module 10A1 includes the switch circuit 11, the phase adjustment circuit 12A1 (12A), phase adjustment circuits 12B1 (12B) and 12C1 (12C), the filter 13A1 (13A), filters 13B1 (13B) and 13C1 (13C), and the antenna common terminal 22.

The radio frequency module 10A1 in the third example corresponds to the embodied mounting configurations of the radio frequency module 10 according to the embodiment. FIG. 9A illustrates the mounting configurations of the filter 13A1 and the phase adjustment circuit 12A1 among the mounting configurations of the radio frequency module 10A1 in the third example. The radio frequency module 10A1 in the present example differs from the radio frequency module 10A in the first example in that a specific circuit structure of a filter will be described, and that the filter 13A1 and the phase adjustment circuit 12A1 share a circuit element. In the following description, the same structures as in the radio frequency module 10A in the first example are omitted, and the differences between the radio frequency module 10A1 in the third example and the radio frequency module 10A in the first example are mainly described.

The filter 13A1 corresponds to the first filter that includes input-output terminals 51 (first input-output terminal) and 52 (second input-output terminal) that are formed on the substrate 100A that has piezoelectricity, series arm resonators s1, s2, s3, and s4, and parallel arm resonators p1, p2, and p3. The input-output terminal 51 is connected to the phase adjustment circuit 12A1.

The series arm resonators s1 to s4 correspond to one or more series arm resonators that are disposed on a first path connecting the input-output terminal 51 and the input-output terminal 52 to each other and that include an acoustic wave resonator. The parallel arm resonators p1 to p3 correspond to one or more parallel arm resonators that are disposed on a second path connecting a node on the first path and the ground to each other and that include an acoustic wave resonator.

Among the series arm resonators s1 to s4 and the parallel arm resonators p1 to p3, only the series arm resonator s1 (first series arm resonator) is directly connected to the input-output terminal 51.

Each of the series arm resonators s1 to s4 and the parallel arm resonators p1 to p3 is, for example, an acoustic wave resonator that uses an acoustic wave, and an example thereof is a resonator that uses a SAW (Surface Acoustic Wave), a resonator that uses a BAW (Bulk Acoustic Wave), or a FBAR (Film Bulk Acoustic Resonator). The SAW includes not only a surface acoustic wave but also a boundary acoustic wave.

The number of the series arm resonators that are included in the filter 13A1 is not limited to 4 provided the number is 1 or more. The number of the parallel arm resonators that are included in the filter 13A1 is not limited to 3 provided that the number is 1 or more. The filter 13A1 may include circuit elements such as a longitudinally coupled resonator, an inductor, and a capacitor in addition to the series arm resonators and the parallel arm resonators.

The phase adjustment circuit 12A1 includes the capacitors Cs1 and Cs2 and the inductor Lp.

The capacitor Cs1 and the capacitor Cs2 respectively correspond to the first circuit element and the second circuit element that are disposed on a path connecting the selection terminal 110a and the filter 13A1 to each other and that are connected to each other in series. The inductor Lp corresponds to the third circuit element that is disposed between the ground and a connection node of the capacitors Cs1 and Cs2.

In the radio frequency module 10A1 in the present example, the series arm resonator s1 includes the capacitor Cs2 and functions as the acoustic wave resonator of the filter 13A1 and a capacitive element of the phase adjustment circuit 12A1. That is, the series arm resonator s1 doubles as the capacitor Cs2.

The filter 13B1 may have the same structure as that of the filter 13A1.

That is, the filter 13B1 corresponds to the second filter that includes a third input-output terminal and a fourth input-output terminal that are formed on the substrate 100B that has piezoelectricity, one or more series arm resonators, and one or more parallel arm resonators. The third input-output terminal is connected to the phase adjustment circuit 12B1.

The one or more series arm resonators are disposed on a third path connecting the third input-output terminal and the fourth input-output terminal to each other. The one or more parallel arm resonators are disposed on a fourth path connecting a node on the third path and the ground to each other.

Among the one or more series arm resonators and the one or more parallel arm resonators, only a second series arm resonator is directly connected to the third input-output terminal.

The phase adjustment circuit 12B1 includes the fourth circuit element (capacitor) and the fifth circuit element (capacitor) that are disposed on a path connecting the selection terminal 110b and the filter 13B1 to each other and that are connected to each other in series and the sixth circuit element that is disposed between the ground and a connection node of the fourth circuit element and the fifth circuit element.

In the radio frequency module 10A1 in the present example, the second series arm resonator includes the fifth circuit element (capacitor) and functions as the acoustic wave resonator of the filter 13B1 and a capacitive element of the phase adjustment circuit 12B1. That is, the second series arm resonator doubles as the fifth circuit element (capacitor).

Figure 9B:
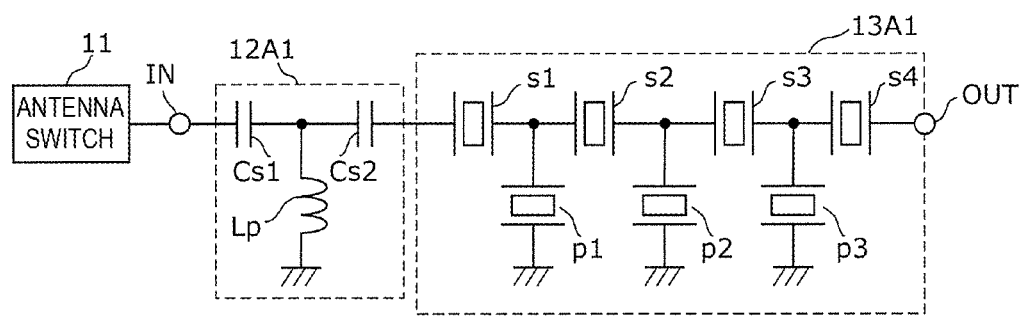
FIG. 9B illustrates an equivalent circuit of the filter and the phase adjustment circuit that are included in the radio frequency module in the third example.
Figure 11:
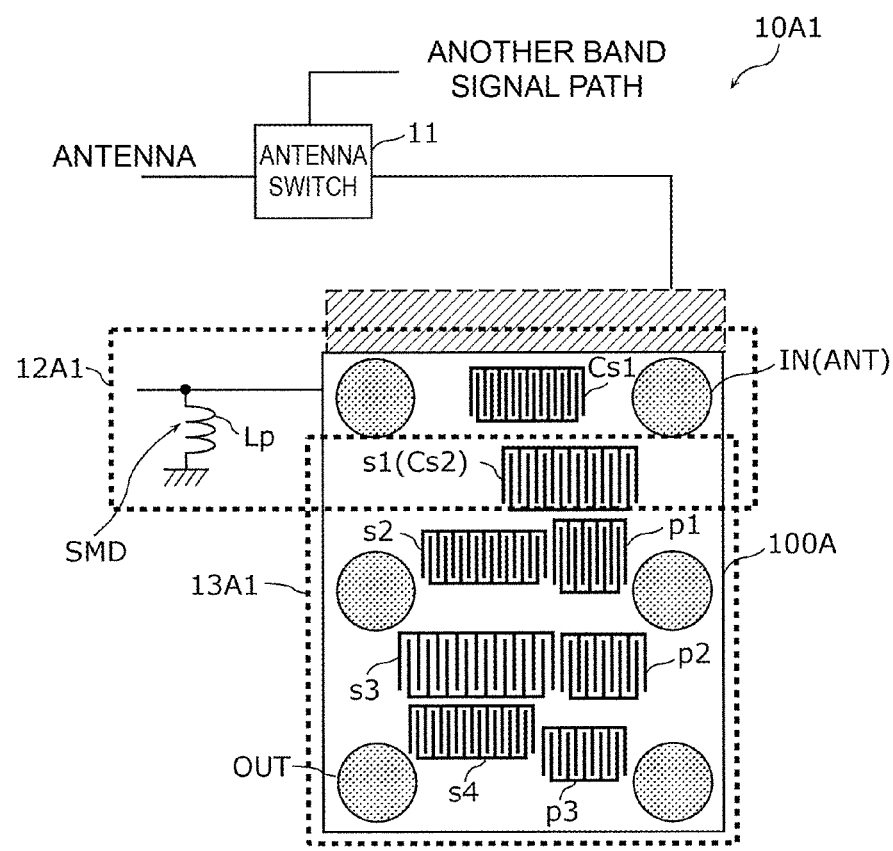
FIG. 11 illustrates arrangement of the filter and the phase adjustment circuit that are included in the radio frequency module in the third example.

FIG. 9B illustrates an equivalent circuit of the filter 13A1 and the phase adjustment circuit 12A1 that are included in the radio frequency module 10A1 in the third example. The circuit illustrated in the figure is the equivalent circuit of the structure in FIG. 9A. The phase adjustment circuit 12A1 includes the capacitors Cs1 and Cs2 and the inductor Lp. The filter 13A1 includes the series arm resonators s1 to s4 and the parallel arm resonators p1 to p3.

In the radio frequency module 10A1 in the present example, the circuit element of the phase adjustment circuit 12A1 that is connected to the input-output terminal 51 is the capacitor Cs2 connected in series. The circuit element of the filter 13A1 that is connected to the input-output terminal 51 is the series arm resonator s1 that is capacitive out of the pass band of the filter 13A1. This enables a single acoustic wave resonator to provide the circuit element (capacitor Cs2) of the phase adjustment circuit 12A1 that is connected to the input-output terminal 51 and the circuit element (series arm resonator s1) of the filter 13A1 that is connected to the input-output terminal 51.

The following description of the present example includes the impedance characteristics of the filter 13A1 and the phase adjustment circuit 12A1 in CA operation of a radio frequency signal in Band1 and a radio frequency signal in Band7. The pass band of the filter 13A1 is Band1, and the attenuation band thereof is Band7. The pass band of the filter 13B1 is Band7, and the attenuation band thereof is Band1. The impedance of the filter 13A1 in the pass band (Band1 band) is preferably close to the characteristic impedance (50Ω), and the impedance thereof in the partner band (Band7 band) is preferably close to a high impedance (open). The impedance of the filter 13B1 in the pass band (Band7 band) is preferably close to the characteristic impedance (50Ω), and the impedance thereof in the partner band (Band1 band) is preferably close to a high impedance (open).

FIGS. 10A, 10B and 10C illustrate Smith charts representing the impedance of the filter 13A1 viewed from nodes of the phase adjustment circuit 12A1 in the third example.

The filter 13A1 is, for example, a surface acoustic wave filter, and the series arm resonator s1 that is capacitive is connected to the input-output terminal 51. For this reason, as illustrated in FIG. 10B, the impedance of the filter 13A1 itself viewed from the node X1 in the own band (Band1) is located in a region nearer than the region of the characteristic impedance (50Ω) to a capacitive region, and the impedance thereof in the CA partner band (Band7) is close to a high impedance and capacitive. Here, the impedance is changed by each circuit element of the phase adjustment circuit 12A1.

The inductor Lp is arranged at the node X1 in parallel with the filter 13A1, and the capacitor Cs1 is arranged in series therewith. Consequently, as illustrated in FIG. 10C, the impedance of the filter 13A1 viewed from the node X2 overall shifts counterclockwise.

In the case of a ladder filter that includes surface acoustic wave resonators one of which is a series arm resonator connected nearest to an input terminal, the impedance when the filter is viewed from the input terminal is capacitive and close to a high impedance (that in the open state). In this case, the phase adjustment circuit is preferably a T-type circuit in which a capacitor is disposed on a series arm, and an inductor is disposed on a parallel arm in order to keep the impedance in the own band equal to the characteristic impedance (50Ω) and to keep the impedance in the CA partner band close to a high impedance (that in the open state). This decreases an amount in which the impedance in the CA partner band is shifted counterclockwise. That is, the inductance value of a parallel arm inductor can be decreased. Accordingly, the impedance matching can be precise, and the size of the phase adjustment circuit can be decreased.

As illustrated in FIG. 10C, the above change in the impedance by using the phase adjustment circuit 12A1 enables the impedance of the filter 13A1 viewed from the node X2 in the own band (Band1) to be close to the characteristic impedance (50Ω) and enables the impedance thereof in the CA partner band (Band7) to be close to a high impedance (open) with the minimum amount of shifting.

Regarding the filter 13B1, the impedance in the own band (Band7) can be close to the characteristic impedance (50Ω), and the impedance in the CA partner band (Band1) can be close to a high impedance (open) with the minimum amount of shifting, as in the above change in the impedance of the filter 13A1.

The circuit elements (for example, the capacitors Cs1 and Cs2) that are included in the phase adjustment circuit 12A1 are formed on the substrate 100A on which the acoustic wave resonator of the filter 13A1 is formed. The circuit element (capacitor Cs2) that is included in the phase adjustment circuit 12A1 is the series arm resonator s1 of the filter 13A1. Similarly, the circuit elements that are included in the phase adjustment circuit 12B1 are formed on the substrate 100B on which the acoustic wave resonator of the filter 13B1 is formed. The circuit element that is included in the phase adjustment circuit 12B1 is the series arm resonator s1 of the filter 13B1. This decreases the number of circuit elements that are formed on neither the substrate 100A nor the substrate 100B among the circuit elements that are included in the phase adjustment circuits 12A1 and 12B1 and decreases the size of the substrates 100A and 100B. Accordingly, the insertion loss in the CA mode is reduced, and the size of the radio frequency module 10A1 can be decreased.

In addition, the noise figure of the front end module 20 that includes the radio frequency module 10A1 can be reduced.

[1.6 Common Structure of Filter Resonator and Phase Adjustment Circuit Capacitor in Fourth Example]

Figure 12A:
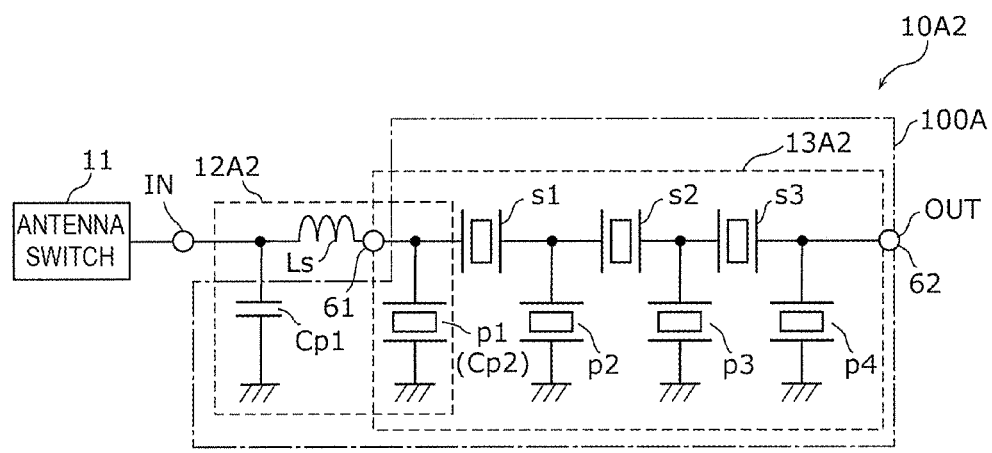
FIG. 12A illustrates the structure of a filter and a phase adjustment circuit that are included in a radio frequency module in a fourth example.

FIG. 12A illustrates the structure of a filter 13A2 and a phase adjustment circuit 12A2 that are included in a radio frequency module 10A2 in a fourth example. The circuit structure of the radio frequency module 10A2 in the present example is the same as that of the radio frequency module 10 illustrated in FIG. 1. The radio frequency module 10A2 includes the switch circuit 11, the phase adjustment circuit 12A2 (12A), phase adjustment circuits 12B2 (12B) and 12C2 (12C), the filter 13A2 (13A), filters 13B2 (13B) and 13C2 (13C), and the antenna common terminal 22.

The radio frequency module 10A2 in the fourth example corresponds to the embodied mounting configurations of the radio frequency module 10 according to the embodiment. FIG. 12A illustrates the mounting configurations of the filter 13A2 and the phase adjustment circuit 12A2 among the mounting configurations of the radio frequency module 10A2 in the fourth example. The radio frequency module 10A2 in the present example differs from the radio frequency module 10A in the first example in that a specific circuit structure of a filter will be described, and that the filter 13A2 and the phase adjustment circuit 12A2 share a circuit element. In the following description, the same structures as in the radio frequency module 10A in the first example are omitted, and the differences between the radio frequency module 10A2 in the fourth example and the radio frequency module 10A in the first example are mainly described.

The filter 13A2 corresponds to the first filter that includes input-output terminals 61 (first input-output terminal) and 62 (second input-output terminal) that are formed on the substrate 100A that has piezoelectricity, the series arm resonators s1, s2, and s3, the parallel arm resonators p1, p2, and p3, and a parallel arm resonator p4. The input-output terminal 61 is connected to the phase adjustment circuit 12A2.

The series arm resonators s1 to s3 correspond to one or more series arm resonators that are disposed on the first path connecting the input-output terminal 61 and the input-output terminal 62 to each other and that include an acoustic wave resonator. The parallel arm resonators p1 to p4 correspond to one or more parallel arm resonators that are disposed on the second path connecting a node on the first path and the ground to each other and that include an acoustic wave resonator.

Among the series arm resonators s1 to s3 and the parallel arm resonators p1 to p4, the parallel arm resonator p1 (first parallel arm resonator) is directly connected to the input-output terminal 61.

Each of the series arm resonators s1 to s3 and the parallel arm resonators p1 to p4 is, for example, an acoustic wave resonator that uses an acoustic wave, and an example thereof is a resonator that uses a SAW, a resonator that uses a BAW, or a FBAR. The SAW includes not only a surface acoustic wave but also a boundary acoustic wave.

The number of the series arm resonators that are included in the filter 13A2 is not limited to 3 provided the number is 1 or more. The number of the parallel arm resonators that are included in the filter 13A2 is not limited to 4 provided that the number is 1 or more. The filter 13A2 may include circuit elements such as a longitudinally coupled resonator, an inductor, and a capacitor in addition to the series arm resonators and the parallel arm resonators.

The phase adjustment circuit 12A2 includes the capacitors Cp1 and Cp2 and an inductor Ls.

The inductor Ls corresponds to the seventh circuit element that is disposed on a path connecting the selection terminal 110a and the filter 13A2 to each other. The capacitor Cp1 corresponds to the eighth circuit element that is disposed between the ground and a connection node of the selection terminal 110a and the inductor Ls. The capacitor Cp2 corresponds to the ninth circuit element that is disposed between the ground and a connection node of the inductor Ls and the filter 13A2.

In the radio frequency module 10A2 in the present example, the parallel arm resonator p1 includes the capacitor Cp2 and functions as the acoustic wave resonator of the filter 13A2 and a capacitive element of the phase adjustment circuit 12A2. That is, the parallel arm resonator p1 doubles as the capacitor Cp2.

The filter 13B2 may have the same structure as that of the filter 13A2.

That is, the filter 13B2 corresponds to the second filter that includes the third input-output terminal and the fourth input-output terminal that are formed on the substrate 100B that has piezoelectricity, one or more series arm resonators, and one or more parallel arm resonators. The third input-output terminal is connected to the phase adjustment circuit 12B2.

The one or more series arm resonators are disposed on the third path connecting the third input-output terminal and the fourth input-output terminal to each other. The one or more parallel arm resonators are disposed on the fourth path connecting a node on the third path and the ground to each other.

Among the one or more series arm resonators and the one or more parallel arm resonators, a second parallel arm resonator is directly connected to the third input-output terminal.

The phase adjustment circuit 12B2 includes the tenth circuit element that is disposed on a path connecting the selection terminal 110b and the filter 13B2 to each other, the eleventh circuit element that is disposed between the ground and a connection node of the selection terminal 110b and the tenth circuit element, and the twelfth circuit element (capacitor) that is disposed between the ground and a connection node of the tenth circuit element and the filter 13B2.

In the radio frequency module 10A2 in the present example, the second parallel arm resonator includes the twelfth circuit element (capacitor) and functions as the acoustic wave resonator of the filter 13B2 and a capacitive element of the phase adjustment circuit 12B2. That is, the second parallel arm resonator doubles as the twelfth circuit element (capacitor).

Figure 12B:
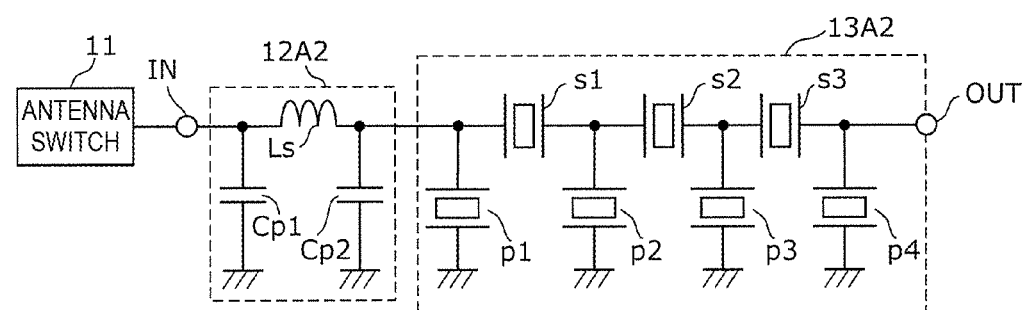
FIG. 12B illustrates an equivalent circuit of the filter and the phase adjustment circuit that are included in the radio frequency module in the fourth example.
Figure 14:
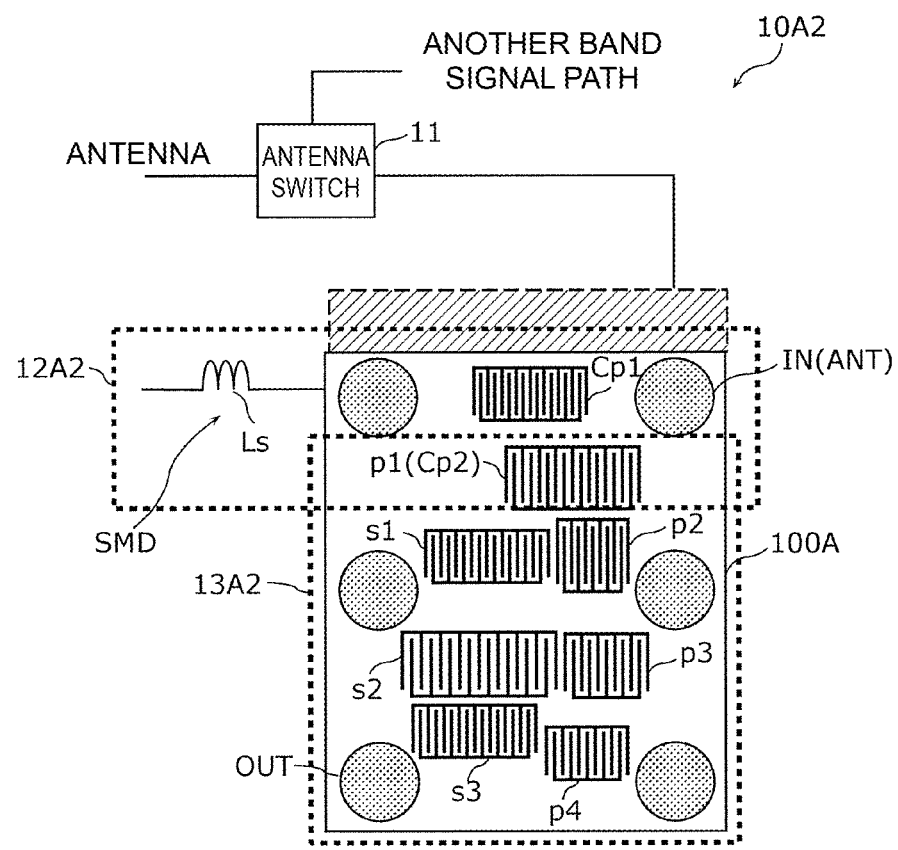
FIG. 14 illustrates arrangement of the filter and the phase adjustment circuit that are included in the radio frequency module in the fourth example.

FIG. 12B illustrates an equivalent circuit of the filter 13A2 and the phase adjustment circuit 12A2 that are included in the radio frequency module 10A2 in the fourth example. The circuit illustrated in the figure is the equivalent circuit of the structure in FIG. 12A. The phase adjustment circuit 12A2 includes the capacitors Cp1 and Cp2 and the inductor Ls. The filter 13A2 includes the series arm resonators s1 to s3 and the parallel arm resonators p1 to p4.

In the radio frequency module 10A2 in the present example, the circuit element of the phase adjustment circuit 12A2 that is connected to the input-output terminal 61 is the capacitor Cp2 connected in parallel. The circuit element of the filter 13A2 that is connected to the input-output terminal 61 is the parallel arm resonator p1 that is capacitive out of the pass band of the filter 13A2. This enables a single acoustic wave resonator to provide the circuit element (capacitor Cp2) of the phase adjustment circuit 12A2 connected to the input-output terminal 61 and the circuit element (parallel arm resonator p1) of the filter 13A2 connected to the input-output terminal 61.

The following description of the present example includes the impedance characteristics of the filter 13A2 and the phase adjustment circuit 12A2 in the CA operation of the radio frequency signal in Band1 and the radio frequency signal in Band7. The pass band of the filter 13A2 is Band1, and the attenuation band thereof is Band7. The pass band of the filter 13B2 is Band7, and the attenuation band thereof is Band1. The impedance of the filter 13A2 in the pass band (Band1 band) is preferably close to the characteristic impedance (50Ω), and the impedance thereof in the partner band (Band7 band) is preferably close to a high impedance (open). The impedance of the filter 13B2 in the pass band (Band7 band) is preferably close to the characteristic impedance (50Ω), and the impedance thereof in the partner band (Band1 band) is preferably close to a high impedance (open).

FIGS. 13A, 13B and 13C illustrate Smith charts representing the impedance of the filter 13A2 viewed from nodes of the phase adjustment circuit 12A2 in the fourth example.

The filter 13A2 is, for example, a surface acoustic wave filter, and the parallel arm resonator p1 that is capacitive is connected to the input-output terminal 61. For this reason, as illustrated in FIG. 13B, the impedance of the filter 13A2 itself viewed from the node X1 in the own band (Band1) is located in a region nearer than the region of the characteristic impedance (50Ω) to a capacitive region, and the impedance thereof in the CA partner band (Band1) is close to a low impedance and capacitive. Here, the impedance is changed by each circuit element of the phase adjustment circuit 12A2.

The inductor Ls is arranged at the node X1 in series with the filter 13A2, and the capacitor Cp1 is arranged in parallel therewith. Consequently, as illustrated in FIG. 13C, the impedance of the filter 13A2 viewed from the node X2 overall shifts clockwise.

In the case of a ladder filter that includes surface acoustic wave resonators one of which is a parallel arm resonator connected nearest to an input terminal, the impedance when the filter is viewed from the input terminal is capacitive and close to a low impedance (that in the short circuit state). In this case, the phase adjustment circuit is preferably a $\pi c$-type circuit in which an inductor is disposed on a series arm, and a capacitor is disposed on a parallel arm in order to keep the impedance in the own band equal to the characteristic impedance (50Ω) and to keep the impedance in the CA partner band close to a high impedance (that in the open state). This decreases an amount in which the impedance in the CA partner band is shifted clockwise. That is, the inductance value of a series arm inductor can be decreased. Accordingly, the impedance matching can be precise, and the size of the phase adjustment circuit can be decreased.

As illustrated in FIG. 13C, the above change in the impedance by using the phase adjustment circuit 12A2 enables the impedance of the filter 13A2 viewed from the node X2 in the own band (Band1) to be close to the characteristic impedance (50Ω) and enables the impedance thereof in the CA partner band (Band7) to be close to a high impedance (open) with the minimum amount of shifting.

Regarding the filter 13B2, the impedance in the own band (Band7) can be close to the characteristic impedance (50Ω), and the impedance in the CA partner band (Band1) can be close to a high impedance (open) with the minimum amount of shifting, as in the above change in the impedance of the filter 13A2.

The circuit elements (for example, the capacitors Cp1 and Cp2) that are included in the phase adjustment circuit 12A2 are formed on the substrate 100A on which the acoustic wave resonator of the filter 13A2 is formed. The circuit element (capacitor Cp2) that is included in the phase adjustment circuit 12A2 is the parallel arm resonator p1 of the filter 13A2. Similarly, the circuit elements that are included in the phase adjustment circuit 12B2 are formed on the substrate 100B on which the acoustic wave resonator of the filter 13B2 is formed. The circuit element that is included in the phase adjustment circuit 12B2 is the parallel arm resonator p1 of the filter 13B2. This decreases the number of circuit elements that are formed on neither the substrate 100A nor the substrate 100B among the circuit elements that are included in the phase adjustment circuits 12A2 and 12B2 and decreases the size of the substrates 100A and 100B. Accordingly, the insertion loss in the CA mode is reduced, and the size of the radio frequency module 10A2 can be decreased.

In addition, the noise figure of the front end module 20 that includes the radio frequency module 10A2 can be reduced.

Other Embodiments

The examples of the radio frequency module, the front end module, and the communication device according to the above embodiment are described above. A radio frequency module, a front end module, and a communication device according to the present disclosure are not limited to the above embodiment and the examples thereof. The present disclosure includes other embodiments obtained by combining freely selected features according to the above embodiment and the examples thereof, modifications obtained by modifying the above embodiment and the examples thereof by a person skilled in the art without departing from the spirit of the present disclosure, and various devices that include a radio frequency module, a front end module, a communication device according to the present disclosure.

For example, a reception circuit that processes a radio frequency signal that is received from the antenna element 2 is described for the radio frequency module 10, the front end module 20, and the communication device 5 according to the above embodiment. However, the radio frequency module, the front end module, and the communication device according to the present disclosure can be used for a transmission circuit that processes a radio frequency signal from the RFIC 3 and that outputs the signal via the antenna element 2. In this case, the front end module includes a transmission amplifier circuit instead of the reception amplifier circuit. Consequently, the insertion loss in the CA mode with simultaneous transmission is reduced, and the size of the radio frequency module can be decreased.

The radio frequency module, the front end module, and the communication device according to the present disclosure can be used for a transmission and reception circuit that includes the reception circuit and the transmission circuit described above. In this case, the radio frequency module includes a transmission filter and a reception filter, and the front end module includes the reception amplifier circuit and the transmission amplifier circuit. Consequently, the insertion loss in the CA mode with simultaneous transmission and/or simultaneous reception is reduced, and the size of the radio frequency module can be decreased.

In each radio frequency module, the front end module, and the communication device according to the above embodiment and the examples thereof, another radio frequency circuit element and a wiring line, for example, may be added between paths connecting the circuit elements and the signal paths to each other, illustrated in the figures.

The present disclosure can be widely used, as a multi-band radio frequency module, a multi-band front end module, and a multi-band communication device that use the carrier aggregation method, for communication equipment such as a cellular phone.

2 antenna element
3 RF integrated circuit (RFIC)
4 base band integrated circuit (BBIC)
5 communication device
10, 10A, 10A1, 10A2, 10D, 500A radio frequency module switch circuit
11a, 11b, 11c switch
12A, 12A1, 12A2, 12B, 12B1, 12B2, 12C, 12D, 512A phase adjustment circuit
13A, 13A1, 13A2, 13B, 13B1, 13B2, 13C, 513A filter
20 front end module
21A, 21B, 21C reception amplifier circuit
22 antenna common terminal
51, 52, 61, 62 input-output terminal
100A, 100B, 100C substrate
110d, 110e, 110f common terminal
110a, 110b, 110c selection terminal
Cp1, Cp2, Cs1, Cs2, Cs3, Cs4, Cs51, Cs52 capacitor
Lp, Lp1, Lp2, Ls inductor
p1, p2, p3 parallel arm resonator
s1, s2, s3, s4 series arm resonator
T1A, T1B, T2A, T2B terminal
Tc common terminal

The invention claimed is:

1. A radio frequency module capable of simultaneously transmitting, or receiving, or transmitting and receiving at least a first signal in a first frequency band and a second signal in a second frequency band having a second frequency different from a first frequency of the first frequency band, the radio frequency module comprising:
a switch circuit including a common terminal, a first selection terminal, and a second selection terminal;
a first filter configured to allow the first signal in the first frequency band to pass therethrough;
a second filter configured to allow the second signal in the second frequency band to pass therethrough;
a first phase adjustment circuit connected between the first selection terminal and the first filter and including one or more first circuit elements; and
a second phase adjustment circuit connected between the second selection terminal and the second filter and including one or more second circuit elements,
wherein the first filter includes a first acoustic wave resonator, and the first acoustic wave resonator includes a first substrate having piezoelectricity and a first interdigital transducer electrode provided on the first substrate,
wherein the second filter includes a second acoustic wave resonator, and the second acoustic wave resonator includes a second substrate having piezoelectricity and a second interdigital transducer electrode provided on the second substrate, and
wherein at least one of the one or more first circuit elements is provided on the first substrate, and at least one of the one or more second circuit elements is provided on the second substrate.

2. The radio frequency module according to claim 1, wherein the first phase adjustment circuit includes
a first circuit element and a second circuit element disposed on a path connecting the first selection terminal and the first filter to each other, and connected to each other in series, and
a third circuit element disposed between a ground and a connection node of the first circuit element and the second circuit element, and
wherein each of the first circuit element, the second circuit element, and the third circuit element is an inductor or a capacitor.

3. The radio frequency module according to claim 2, wherein the first filter includes
a first input-output terminal provided on the first substrate and connected to the first phase adjustment circuit,
a second input-output terminal provided on the first substrate,
one or more series arm resonators disposed on a first path connecting the first input-output terminal and the second input-output terminal to each other and including the first acoustic wave resonator, and
one or more parallel arm resonators disposed on a second path connecting a node on the first path and the ground to each other and including the first acoustic wave resonator,
wherein, among the one or more series arm resonators and the one or more parallel arm resonators, only a first series arm resonator is directly connected to the first input-output terminal,
wherein the second circuit element, of the first circuit element and the second circuit element, is connected to the first input-output terminal, and
wherein the first series arm resonator includes the second circuit element and functions as the first acoustic wave resonator of the first filter and a capacitive element of the first phase adjustment circuit.

4. The radio frequency module according to claim 1, wherein the second phase adjustment circuit includes
a fourth circuit element and a fifth circuit element disposed on a path connecting the second selection terminal and the second filter to each other and that are connected to each other in series, and
a sixth circuit element disposed between a ground and a connection node of the fourth circuit element and the fifth circuit element, and
wherein each of the fourth circuit element, the fifth circuit element, and the sixth circuit element is an inductor or a capacitor.

5. The radio frequency module according to claim 4, wherein the second filter includes
a third input-output terminal provided on the second substrate and connected to the second phase adjustment circuit,
a fourth input-output terminal provided on the second substrate,
one or more series arm resonators disposed on a third path connecting the third input-output terminal and the fourth input-output terminal to each other and including the second acoustic wave resonator, and
one or more parallel arm resonators disposed on a fourth path connecting a node on the third path and the ground to each other and including the second acoustic wave resonator,
wherein, among the one or more series arm resonators and the one or more parallel arm resonators, only a second series arm resonator is directly connected to the third input-output terminal,
wherein the fifth circuit element, of the fourth circuit element and the fifth circuit element, is connected to the third input-output terminal, and
wherein the second series arm resonator includes the fifth circuit element and functions as the second acoustic wave resonator of the second filter and a capacitive element of the second phase adjustment circuit.

6. The radio frequency module according to claim 1, wherein the first phase adjustment circuit includes
a seventh circuit element disposed on a path connecting the first selection terminal and the first filter to each other,
an eighth circuit element disposed between a ground and a connection node of the first selection terminal and the seventh circuit element, and
a ninth circuit element disposed between the ground and a connection node of the seventh circuit element and the first filter, and
wherein each of the seventh circuit element, the eighth circuit element, and the ninth circuit element is an inductor or a capacitor.

7. The radio frequency module according to claim 6, wherein the first filter includes
a first input-output terminal provided on the first substrate and connected to the first phase adjustment circuit,
a second input-output terminal provided on the first substrate,
one or more series arm resonators disposed on a first path connecting the first input-output terminal and the second input-output terminal to each other and including the first acoustic wave resonator, and
one or more parallel arm resonators disposed on a second path connecting a node on the first path and the ground to each other and including the first acoustic wave resonator,
wherein, among the one or more series arm resonators and the one or more parallel arm resonators, a first parallel arm resonator is directly connected to the first input-output terminal,
wherein the ninth circuit element, of the eighth circuit element and the ninth circuit element, is connected to the first input-output terminal, and
wherein the first parallel arm resonator includes the ninth circuit element and functions as the first acoustic wave resonator of the first filter and a capacitive element of the first phase adjustment circuit.

8. The radio frequency module according to claim 1, wherein the second phase adjustment circuit includes
a tenth circuit element disposed on a path connecting the second selection terminal and the second filter to each other,
an eleventh circuit element disposed between a ground and a connection node of the second selection terminal and the tenth circuit element, and
a twelfth circuit element disposed between the ground and a connection node of the tenth circuit element and the second filter, and
wherein each of the tenth circuit element, the eleventh circuit element, and the twelfth circuit element is an inductor or a capacitor.

9. The radio frequency module according to claim 8, wherein the second filter includes
a third input-output terminal provided on the second substrate and connected to the second phase adjustment circuit,
a fourth input-output terminal provided on the second substrate,
one or more series arm resonators disposed on a third path connecting the third input-output terminal and the fourth input-output terminal to each other and including the second acoustic wave resonator, and
one or more parallel arm resonators disposed on a fourth path connecting a node on the third path and the ground to each other and including the second acoustic wave resonator, and wherein, among the one or more series arm resonators and the one or more parallel arm resonators, a second parallel arm resonator is directly connected to the third input-output terminal, wherein the twelfth circuit element, of the eleventh circuit element and the twelfth circuit element, is connected to the third input-output terminal, and wherein the second parallel arm resonator includes the twelfth circuit element and functions as the second acoustic wave resonator of the second filter and a capacitive element of the second phase adjustment circuit.

10. The radio frequency module according to claim 1, wherein the one or more circuit elements included in the first phase adjustment circuit include a first capacitor, and wherein the first capacitor is provided on the first substrate.

11. The radio frequency module according to claim 10, wherein the first capacitor includes a comb teeth capacitance electrode provided on the first substrate.

12. The radio frequency module according to claim 11, wherein a resonant frequency and an anti-resonant frequency of the first capacitor are in a band lower or higher than the first frequency band.

13. The radio frequency module according to claim 11, wherein, in a plan view of the first substrate, a first direction perpendicular to electrode fingers included in the comb teeth capacitance electrode and parallel to each other differs from a second direction perpendicular to electrode fingers included in the first interdigital transducer electrode and parallel to each other.

14. The radio frequency module according to claim 13, wherein the first substrate satisfies that an angle between the first direction and the second direction is no less than 80° and no more than 100°.

15. The radio frequency module according to claim 1, wherein the radio frequency module simultaneously transmits, or receives, or transmits and receives the first signal in the first frequency band and the second signal in the second frequency band when the common terminal and the first selection terminal are in a conducting state, and the common terminal and the second selection terminal are in a conducting state.

16. The radio frequency module according to claim 1, wherein the switch circuit further includes a third selection terminal and a fourth selection terminal, wherein the radio frequency module further comprises:
a third filter configured to allow a third signal in a third frequency band having a third frequency different from each of the first and second frequencies of the first frequency band and the second frequency band to pass therethrough;
a fourth filter configured to allow a fourth signal in a fourth frequency band having a fourth frequency different from each of the first, second and third frequencies of the first frequency band, the second frequency band, and the third frequency band to pass therethrough;
a third phase adjustment circuit connected between the third selection terminal and the third filter and including one or more third circuit elements; and
a fourth phase adjustment circuit connected between the fourth selection terminal and the fourth filter and including one or more fourth circuit elements, wherein the third filter includes a third acoustic wave resonator, and the third acoustic wave resonator includes a third substrate having piezoelectricity and a third interdigital transducer electrode provided on the third substrate, wherein the fourth filter includes a fourth acoustic wave resonator, and the fourth acoustic wave resonator includes a fourth substrate having piezoelectricity and a fourth interdigital transducer electrode provided on the fourth substrate, wherein at least one of the one or more third circuit elements is provided on the third substrate, and at least one of the one or more fourth circuit elements is provided on the fourth substrate, wherein the first frequency band is a Band1 reception band having 2110 to 2170 MHz of Long Term Evolution, wherein the second frequency band is a Band3 reception band having 1805 to 1880 MHz of Long Term Evolution, wherein the third frequency band is a Band1 reception band having 2620 to 2690 MHz of Long Term Evolution, wherein the fourth frequency band is a Band5 reception band having 869 to 894 MHz, a Band8 reception band having 925 to 960 MHz, a Band20 reception band having 791 to 821 MHz, or a Band40 band having 2300 to 2400 MHz of Long Term Evolution, and wherein the radio frequency module simultaneously transmits, or receives, or transmits and receives at least two signals among the first signal in the first frequency band, the second signal in the second frequency band, the third signal in the third frequency band, and the fourth signal in the fourth frequency band.

17. The radio frequency module according to claim 1, wherein the switch circuit further includes a third selection terminal and a fourth selection terminal, wherein the radio frequency module further comprises:
a third filter configured to allow a third signal in a third frequency band having a third frequency different from each of the first and second frequencies of the first frequency band and the second frequency band to pass therethrough;
a fourth filter configured to allow a fourth signal in a fourth frequency band having a fourth frequency different from each of the first, second and third frequencies of the first frequency band, the second frequency band, and the third frequency band to pass therethrough;
a third phase adjustment circuit connected between the third selection terminal and the third filter and including one or third more circuit elements; and
a fourth phase adjustment circuit connected between the fourth selection terminal and the fourth filter and including one or more fourth circuit elements, wherein the third filter includes a third acoustic wave resonator, and the third acoustic wave resonator includes a third substrate having piezoelectricity and a third interdigital transducer electrode provided on the third substrate, wherein the fourth filter includes a fourth acoustic wave resonator, and the fourth acoustic wave resonator includes a fourth substrate having piezoelectricity and a fourth interdigital transducer electrode provided on the fourth substrate, wherein at least one of the one or more third circuit elements is provided on the third substrate, and at least one of the one or more fourth circuit elements is provided on the fourth substrate, wherein the first frequency band is a Band2 reception band having 1930 to 1990 MHz of Long Term Evolution, wherein the second frequency band is a Band4 reception band having 2110 to 2155 MHz of Long Term Evolution, wherein the third frequency band is a Band30 reception band having 2350 to 2360 MHz of Long Term Evolution, wherein the fourth frequency band is a Band5 reception band having 869 to 894 MHz, a Band29 reception band having 717 to 728 MHz, or a Band12 reception band having 729 to 746 MHz of Long Term Evolution, and wherein the radio frequency module simultaneously transmits, or receives, or transmits and receives at least two signals among the first signal in the first frequency band, the second signal in the second frequency band, the third signal in the third frequency band, and the fourth signal in the fourth frequency band.

18. A front end module comprising:
the radio frequency module according to claim 1;
a first amplifier circuit connected to the first filter; and
a second amplifier circuit connected to the second filter.

19. A communication device comprising:
a radio-frequency integrated circuit configured to process a radio frequency signal transmitted and received by an antenna element; and
the front end module according to claim 18 communicating the radio frequency signal between the antenna element and the radio-frequency integrated circuit.

20. The radio frequency module according to claim 2,
wherein the second phase adjustment circuit includes
a fourth circuit element and a fifth circuit element disposed on a path connecting the second selection terminal and the second filter to each other and that are connected to each other in series, and
a sixth circuit element disposed between a ground and a connection node of the fourth circuit element and the fifth circuit element, and
wherein each of the fourth circuit element, the fifth circuit element, and the sixth circuit element is an inductor or a capacitor.

* * * * *

UNITED STATES PATENT AND TRADEMARK OFFICE
CERTIFICATE OF CORRECTION

PATENT NO. : 11,206,010 B2
APPLICATION NO. : 16/788805
DATED : December 21, 2021
INVENTOR(S) : Miyazaki It is certified that error appears in the above-identified patent and that said Letters Patent is hereby corrected as shown below:

In the Specification

Column 5, Line 46, "a 7c-type circuit in which" should be -- a π-type circuit in which --.

Column 7, Line 6, "a Band1 reception band" should be -- a Band7 reception band --.

Column 8, Line 27, "a Band1 filter are connected" should be -- a Band7 filter are connected --.

Column 8, Line 31, "and the Band1 filter are" should be -- and the Band7 filter are --.

Column 16, Line 45, "and the Band1 filter)" should be -- and the Band7 filter) --.

Column 18, Line 63, "CA partner band (Band1)" should be -- CA partner band (Band7) --.

Column 20, Line 15, "as a so-called 7c-type" should be -- as a so-called π-type --.

Column 28, Line 20, "partner band (Band1) is close" should be -- partner band (Band7) is close --.

Column 28, Line 34, "preferably a 7c-type" should be -- preferable a π-type --.

Column 30, Line 4, "switch circuit" should be -- 11 switch circuit --.

In the Claims

Column 34, Line 22, "band is a Band1 reception" should be -- band is a Band7 reception --.

Signed and Sealed this
Sixth Day of September, 2022

Katherine Kelly Vidal
*Director of the United States Patent and Trademark Office*